United States Patent
Song et al.

(10) Patent No.: US 11,444,068 B2
(45) Date of Patent: Sep. 13, 2022

(54) THREE-DIMENSIONAL (3D) INTEGRATED CIRCUIT DEVICE HAVING A BACKSIDE POWER DELIVERY NETWORK

(71) Applicant: QUALCOMM Incorporated, San Diego, CA (US)

(72) Inventors: Stanley Seungchul Song, San Diego, CA (US); Jonghae Kim, San Diego, CA (US); Periannan Chidambaram, San Diego, CA (US); Pratyush Kamal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 16/928,939

(22) Filed: Jul. 14, 2020

(65) Prior Publication Data

US 2022/0020735 A1      Jan. 20, 2022

(51) Int. Cl.
| | |
|---|---|
| *H01L 25/18* | (2006.01) |
| *H01L 25/00* | (2006.01) |
| *H01L 23/00* | (2006.01) |
| *H01L 21/762* | (2006.01) |
| *H01L 21/48* | (2006.01) |

(52) U.S. Cl.
CPC .......... *H01L 25/18* (2013.01); *H01L 21/4853* (2013.01); *H01L 21/76254* (2013.01); *H01L 24/08* (2013.01); *H01L 24/80* (2013.01); *H01L 25/50* (2013.01); *H01L 2224/08145* (2013.01); *H01L 2224/80895* (2013.01)

(58) Field of Classification Search
None
See application file for complete search history.

(56) References Cited

U.S. PATENT DOCUMENTS

| | | | | |
|---|---|---|---|---|
| 8,093,717 | B2* | 1/2012 | Buot | H01L 25/16 |
| | | | | 257/723 |
| 8,759,147 | B2* | 6/2014 | Choi | H01L 24/97 |
| | | | | 438/106 |
| 8,933,562 | B2* | 1/2015 | Kinser | F25B 21/02 |
| | | | | 257/738 |
| 9,076,754 | B2* | 7/2015 | Hung | H01L 23/42 |
| 9,167,692 | B2* | 10/2015 | Shimizu | H01L 21/486 |
| 10,600,706 | B2* | 3/2020 | Lee | H01L 23/16 |
| 11,145,657 | B1* | 10/2021 | Or-Bach | G11C 5/025 |
| 11,158,580 | B2* | 10/2021 | Sio | H01L 25/18 |
| 11,189,585 | B2* | 11/2021 | Mueller | H01L 24/08 |
| 11,282,816 | B2* | 3/2022 | Yu | H01L 24/82 |

(Continued)

FOREIGN PATENT DOCUMENTS

CN          107240593 A     * 10/2017

*Primary Examiner* — Telly D Green
(74) *Attorney, Agent, or Firm* — Qualcomm Incorporated

(57) ABSTRACT

An integrated circuit (IC) package is described. The IC package includes a power delivery network. The IC package also includes a first die having a first surface and a second surface, opposite the first surface. The second surface is on a first surface of the power delivery network. The IC package further includes a second die having a first surface on the first surface of the first die. The IC package also includes package bumps on a second surface of the power delivery network, opposite the first surface of the power delivery network. The package bumps are coupled to contact pads of the power delivery network.

10 Claims, 24 Drawing Sheets

(56) References Cited

U.S. PATENT DOCUMENTS

| | | | |
|---|---|---|---|
| 2003/0146517 A1* | 8/2003 | Lasky | H01L 25/0657 257/777 |
| 2012/0112352 A1* | 5/2012 | Chi | H01L 23/481 257/784 |
| 2012/0292777 A1* | 11/2012 | Lotz | H01L 23/5286 438/459 |
| 2016/0379960 A1* | 12/2016 | Huang | H01L 25/50 257/432 |
| 2017/0323920 A1* | 11/2017 | Kumar | H01L 27/1464 |
| 2018/0277530 A1* | 9/2018 | Or-Bach | H01L 21/7806 |
| 2018/0331094 A1* | 11/2018 | DeLaCruz | H01L 25/0657 |
| 2020/0219771 A1* | 7/2020 | DeLaCruz | H01L 25/0657 |
| 2020/0373331 A1* | 11/2020 | Kim | H01L 23/535 |
| 2021/0118805 A1* | 4/2021 | Sio | H01L 24/20 |
| 2021/0175192 A1* | 6/2021 | Mueller | H01L 24/03 |
| 2021/0233851 A1* | 7/2021 | Chun | H01L 27/0694 |
| 2021/0242152 A1* | 8/2021 | Fountain, Jr. | H01L 24/80 |
| 2021/0407942 A1* | 12/2021 | Yu | H01L 24/19 |
| 2022/0028829 A1* | 1/2022 | Cheng | H01L 25/0652 |

\* cited by examiner

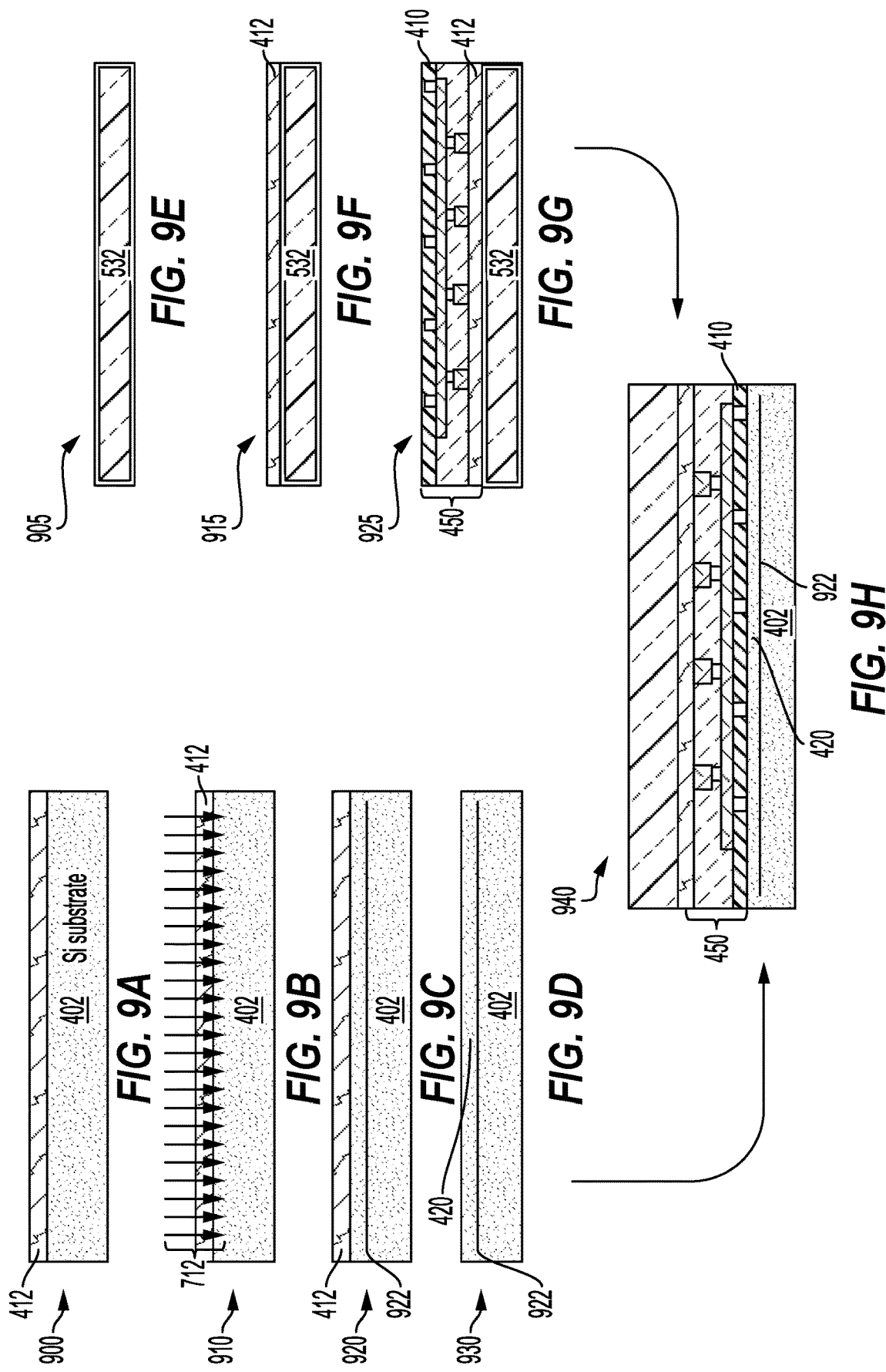

THREE-DIMENSIONAL (3D) INTEGRATED CIRCUIT DEVICE HAVING A BACKSIDE POWER DELIVERY NETWORK

BACKGROUND

Field

Aspects of the present disclosure relate to integrated circuits and, more particularly, to a three-dimensional (3D) integrated circuit (IC) device integrated with a backside power delivery network (PDN).

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. Fabrication of these mobile application devices, however, is susceptible to control issues during backside processing due to the small form factor.

SUMMARY

An integrated circuit (IC) package is described. The IC package includes a power delivery network. The IC package also includes a first die having a first surface and a second surface, opposite the first surface. The second surface is on a first surface of the power delivery network. The IC package further includes a second die having a first surface on the first surface of the first die. The IC package also includes package bumps on a second surface of the power delivery network, opposite the first surface of the power delivery network. The package bumps are coupled to contact pads of the power delivery network.

A method for fabricating a 3D IC device integration package is described. The method includes concurrently forming a power delivery network on a temporary carrier wafer and forming a material separation layer within a semiconductor substrate. The method also includes bonding an exposed surface of the power delivery network to an active layer of the semiconductor substrate. The method further includes separating the semiconductor substrate at the material separation layer to expose a surface of the active layer. The method also includes forming a first die from the active layer having a first surface opposite the active layer. The method further includes bonding a second die to the first surface of the first die.

An integrated circuit (IC) package is described. The IC package includes a power delivery network. The IC package also includes a first die having a first surface and a second surface, opposite the first surface. The second surface is on a first surface of the power delivery network. The IC package further includes means for storing data having a first surface on the first surface of the first die. The IC package also includes package bumps on a second surface of the power delivery network, opposite the first surface of the power delivery network. The package bumps are coupled to contact pads of the power delivery network.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
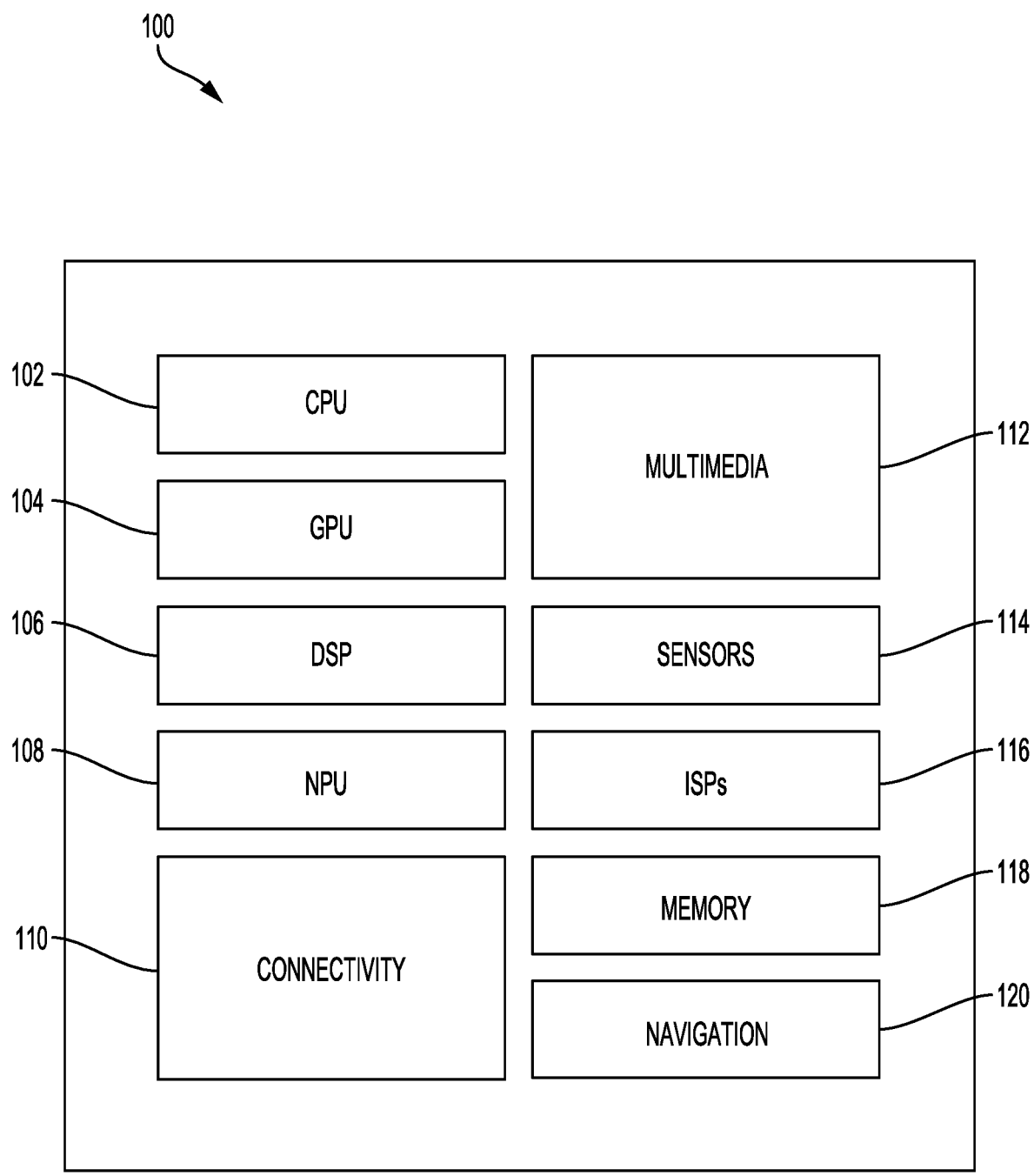
FIG. 1 illustrates an example implementation of a system-on-a-chip (SOC), including a 3D integrated circuit (IC) device integrated with a backside power delivery network, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit (IC). As ICs become more complex, however, more interconnect layers are used to provide the electrical connections between the devices. More recently, the number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a new development in packaging technology that is useful for mobile applications. This chip first FO-WLP process technology solution provides flexibility to fan-in and fan-out connections from a die to a package ball. In addition, this solution also provides a height reduction of a first level interconnect between the die and the package balls of mobile application devices. Fabrication of these mobile application devices, however, is susceptible to control issues during backside processing due to the small form factor.

In conventional devices, a backside semiconductor (e.g., silicon (Si)) substrate is grinded during a backside reveal process. For example, a semiconductor substrate is thinned down from an initial thickness (e.g., 600 microns) to a final thickness (e.g., 1 micron). This significant backside thinning process is difficult to control. One prior solution performs an epitaxial process to grow a compound semiconductor layer (e.g., silicon germanium (SiGe)/silicon (Si)) to provide an active semiconductor substrate. In this solution, the compound semiconductor (e.g., SiGe) layer is used as an etch stop layer during the backside revealing process. Unfortunately, the epitaxial process is very slow and involves performing a significant grinding process to thin the thick substrate.

Various aspects of the present disclosure provide 3D IC devices integrated with a backside power delivery network (PDN). The process flow for fabrication of the 3D IC integrated with the backside power delivery network may include a WLP process technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. The terms "substrate," "wafer," and "laminate" may be used interchangeably. Similarly, the terms "chip," "chiplet," and "die" may be used interchangeably.

In one aspect of the present disclosure, a proposed method avoids a backside grinding process by performing a separation process using a material separation layer rather than an etch stop layer. In this aspect of the present disclosure, a temporary carrier wafer is built into a portion of a modified layer-transfer process. This configuration enables precise control of a remaining front side thickness. This aspect of the present disclosure relies on an organic/inorganic bonding material as a dielectric material for a first layer of a backside metallization process. In this configuration, a layer-transfer process is combined with a temporary bonding process.

Aspects of the present disclosure apply a temporary bonding process and a layer-transfer process to both a front side and a backside of an IC device in a sequential process flow. In one aspect of the present disclosure, a layer-transfer process uses a bonding material and/or oxide on a surface of a semiconductor substrate. This process flow may include bonding of a temporary carrier wafer to a backside of a wafer with a temporary bonding material. This temporary carrier wafer may be a conventional semiconductor (e.g., silicon (Si)) substrate or a glass substrate.

After the layer-transfer and temporary carrier process is complete, a front side process is performed using a conventional process flow. For example, a de-bonding process uses a chemical/thermal/mechanical method. In addition, a laser process may be performed when using a glass carrier wafer. In one configuration, a front side wafer is bonded before performing the backside carrier wafer de-bonding process. In some configurations, the front side wafer may be a dummy carrier wafer to provide mechanical strength and/or a functional wafer (e.g., memory, etc.). A backside process is next performed with or without removing a bonding material in the backside.

Another aspect of the present disclosure performs a backside process before performing a front side process to fabricate a backside power delivery network of a 3D IC device. In this aspect of the present disclosure, the backside power delivery network is formed before a front side process and a layer-transfer process to process both the front side and backside of the 3D IC device in a sequential process flow. The layer-transfer process uses a bonding material and/or an oxide material on a surface of the semiconductor substrate.

The backside process is completed prior to bonding to a front side wafer and before the layer-transfer process. After the layer-transfer, a front side process is performed using a conventional process flow. In addition, a carrier wafer is bonded on a front side of the 3D IC device to remove the dummy backside material and reveal a backside device. In one configuration, a carrier wafer may be another device (e.g., a memory die) for the 3D IC device. In this configuration, the other device is integrated on a front side to form the 3D IC device. The proposed method obviates backside grinding and, thus, avoids a separate etch stop layer.

Backside processing occurs before the front side process, using a material separation built-in, so precise backside material removal is possible. The backside process occurs before a front side process. In this configuration, a 3D IC device is on a front side, which avoids thermal damage from subsequent backside processing. One aspect of the present disclosure relies on a high temperature compatible metallization (e.g., tungsten (W), ruthenium (Ru), etc.) for a backside metallization (e.g., due to sustaining of a front side process). A 3D IC device also may be a thermally sensitive device (e.g., a dynamic random access memory (DRAM)).

FIG. 1 illustrates an example implementation of a host system-on-a-chip (SOC) 100, which includes a 3D IC device integrated with a backside power delivery network, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
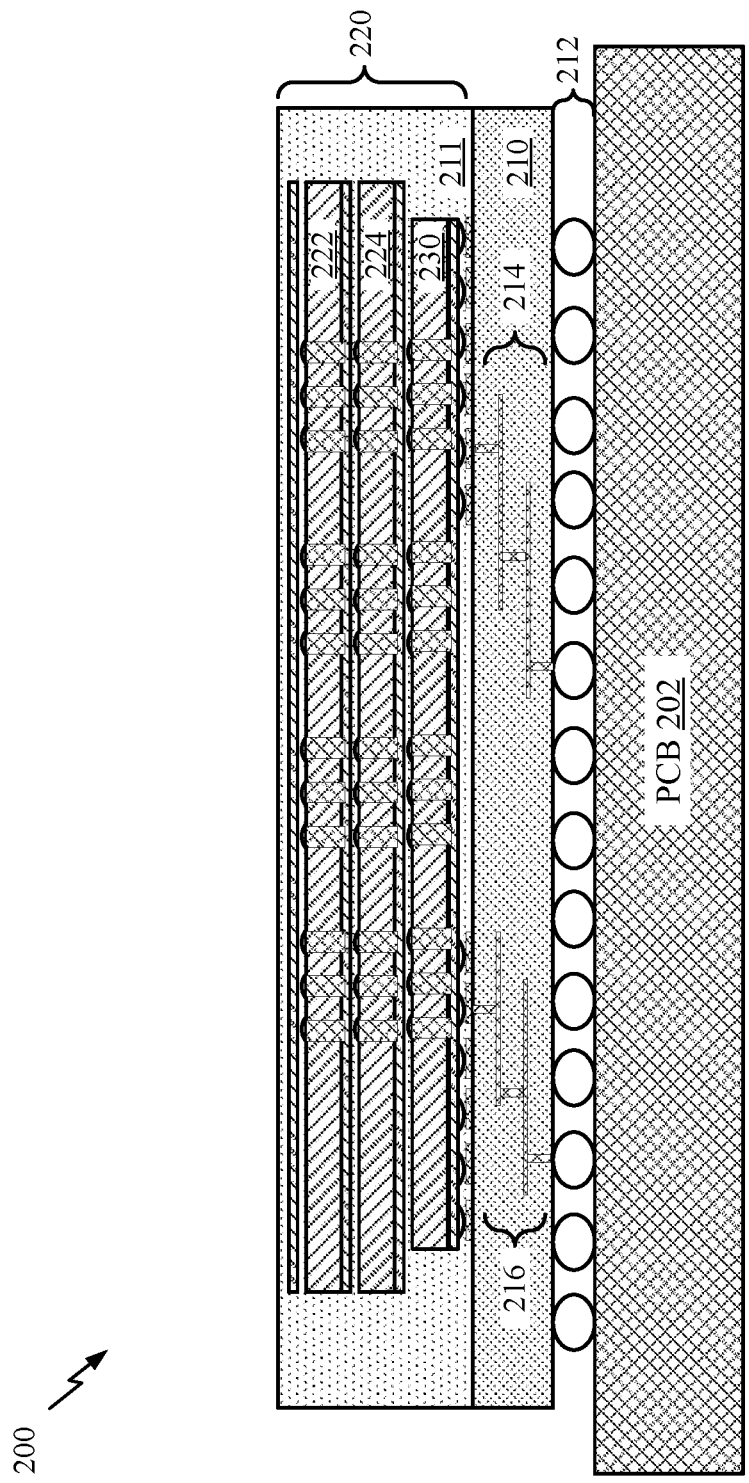
FIG. 2 shows a cross-sectional view of a stacked integrated circuit (IC) package, including the SOC of FIG. 1.

FIG. 2 shows a cross-sectional view illustrating a stacked IC package 200 of the SOC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SOC of FIG. 1.

Figure 3:
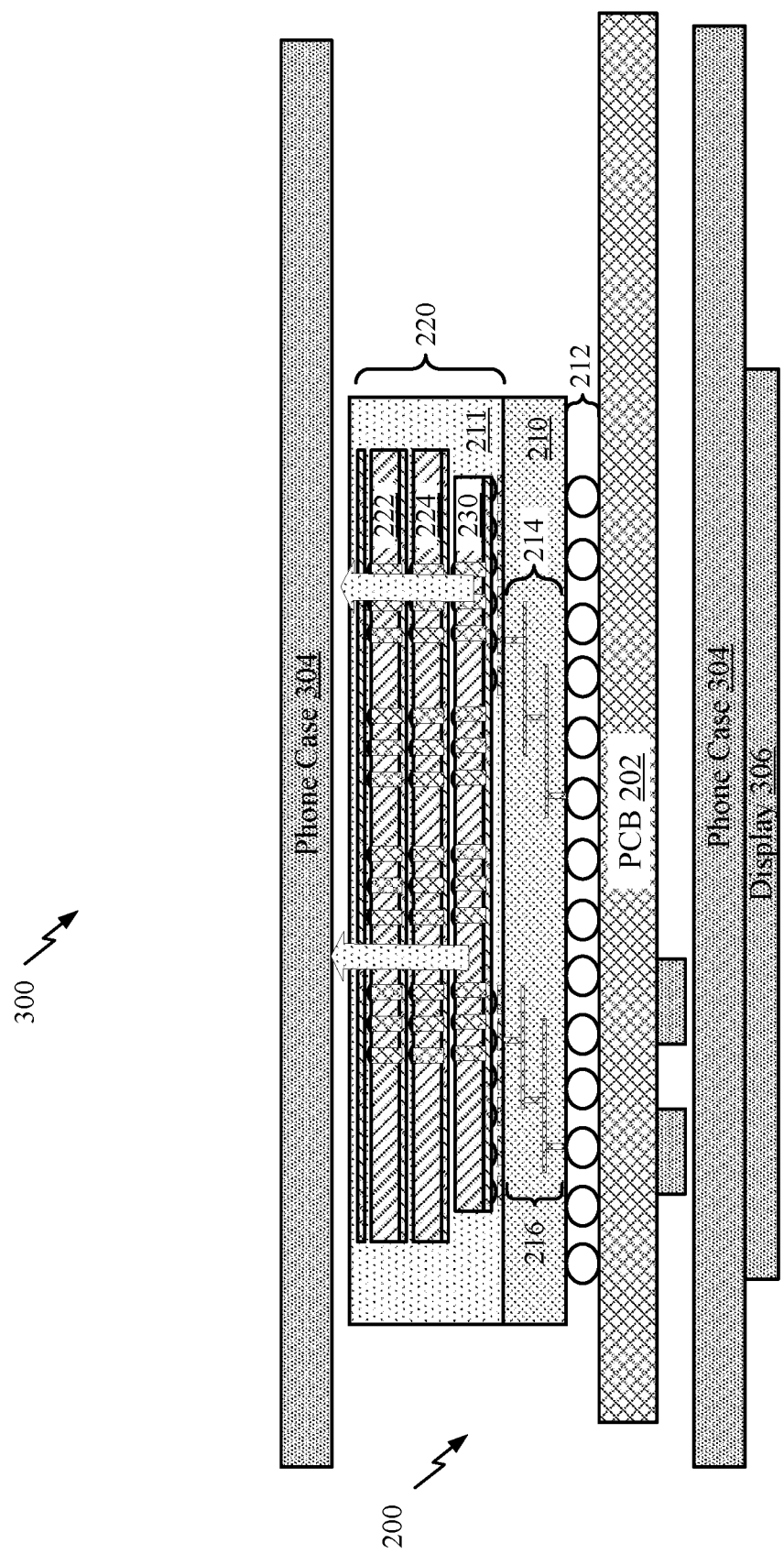
FIG. 3 shows a cross-sectional view illustrating the stacked integrated circuit (IC) package of FIG. 2, incorporated into a mobile device, according to one aspect of the present disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is within a phone case 304, including a display 306. In this configuration, a 3D IC device having a backside power delivery network is integrated into the stacked IC package 200, for example, as shown in FIGS. 4A and 4B.

Figure 4A:
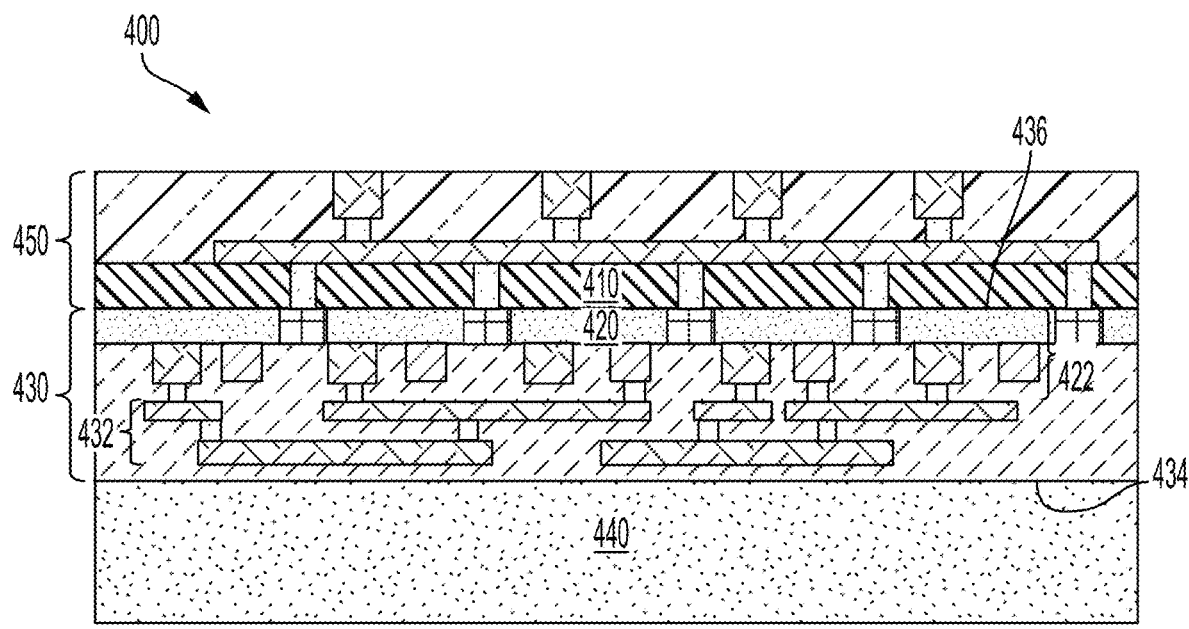
FIGS. 4A and 4B illustrate integrated circuit (IC) packages, having a logic die, a backside power delivery network, and a front side wafer, according to aspects of the present disclosure.
Figure 4B:
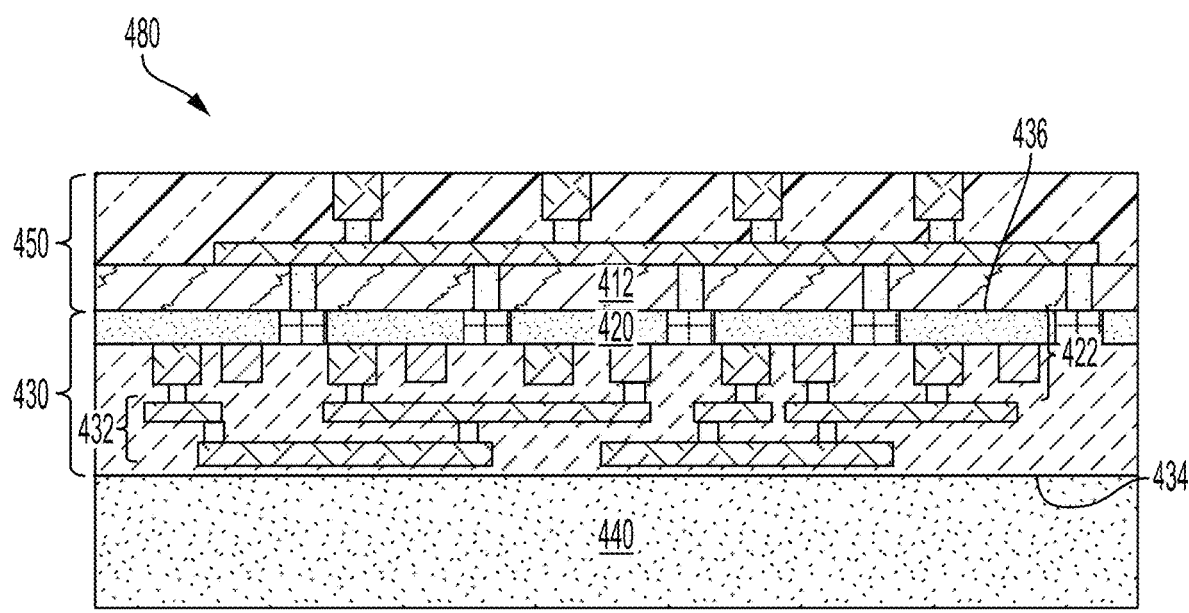

FIGS. 4A and 4B illustrate IC packages, having a logic die 430, a backside power delivery network 450, and a front side wafer 440, according to aspects of the present disclosure. FIGS. 5A-5J are cross-sectional diagrams illustrating a process of fabricating an IC package 400 of FIG. 4A, having a logic die (e.g., a first die) integrated with a backside power delivery network and a front side wafer, according to aspects of the present disclosure. FIGS. 6A-6L are cross-sectional diagrams illustrating a process of fabricating an IC package 460 of FIG. 4B, having a logic die integrated with a backside power delivery network and a front side wafer, according to another aspect of the present disclosure. FIGS. 7A-7L are cross-sectional diagrams illustrating an alternate process of fabricating the IC package 460 of FIG. 4B, having a logic die integrated with a backside power delivery network and a front side wafer, according to aspects of the present disclosure.

FIG. 4A illustrates an IC package 400 having a logic die 430 including a backside power delivery network 450 and a front side wafer, according to aspects of the present disclosure. In one aspect of the present disclosure, a backside grinding process as well as an associated separation process (e.g., using an etch stop layer) are avoided when forming an active layer 420 (e.g., an active semiconductor layer) of the logic die 430. In this configuration, the logic die 430 may include active devices 422 formed from the active layer 420 and coupled to a BEOL metallization structure 432. In addition, a front side wafer 440 is coupled to a front side surface 434 of the logic die 430. In this configuration, the backside power delivery network 450 is coupled to a backside 436 of the logic die 430 through a bonding material 410 (e.g., a bonding layer).

FIG. 4B illustrates an IC package 460, also having the logic die 430, including the backside power delivery network 450 and the front side wafer 440, according to aspects of the present disclosure. In this aspect of the present disclosure, the bonding material 410 of FIG. 4A is replaced by an oxide material 412 (e.g., an oxide layer) to form the IC package 460. In this configuration, the logic die 430 also includes the active devices 422 formed from the active layer 420 and coupled to the BEOL metallization structure 432. In addition, the front side wafer 440 is coupled to the front side surface 434 of the logic die 430. The backside power delivery network 450, however, is coupled to the backside 436 of the logic die 430 through the oxide material 412.

In these aspects of the present disclosure, a temporary carrier wafer is built into a portion of a modified smart-cut process to form the IC packages 400 and 460 shown in FIGS. 4A and 4B. This configuration enables precise control of a remaining front side thickness. In particular, these aspects of the present disclosure rely on an organic/inorganic bonding material as a dielectric material for a first layer of a backside process. In this configuration, a smart-cut process is combined with a temporary bonding process, as shown in FIGS. 5A-7L.

FIGS. 5A-5J are cross-sectional diagrams illustrating a process of fabricating the IC package 400 of FIG. 4A, having an organic/inorganic bonding material as a dielectric material for a first layer of a backside process, according to aspects of the present disclosure.

Figure 5A:
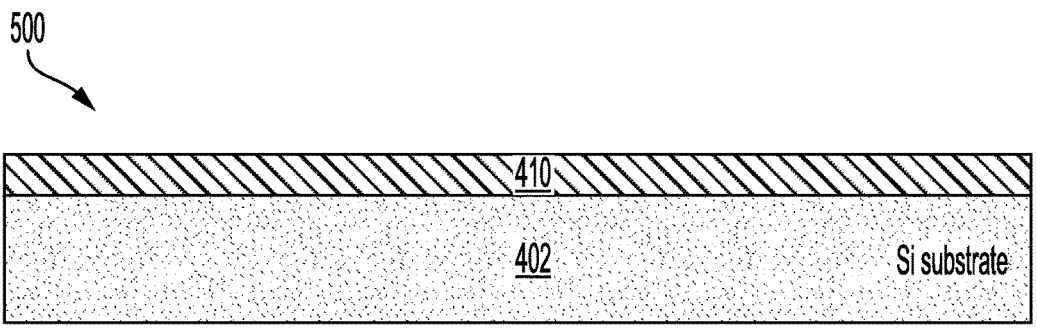
FIGS. 5A-5J are cross-sectional diagrams illustrating a process of fabricating the integrated circuit (IC) package of FIG. 4A, having an organic/inorganic bonding material as a dielectric material for a first layer of a backside process, according to aspects of the present disclosure.

As shown in FIG. 5A, at step 500, the bonding material 410 is deposited on a surface of a semiconductor substrate 402, according to an aspect of the present disclosure. In this example, the bonding material 410 is composed of an organic/inorganic material. In one aspect of the present disclosure, the bonding material 410 provides a dielectric material for a first layer of the backside power delivery network 450. The front side wafer 440 may be initially diced from a wafer of logic dies and cleaned before attachment to the front side surface 434 of the logic die 430, as shown below in FIG. 5H.

Figure 5B:
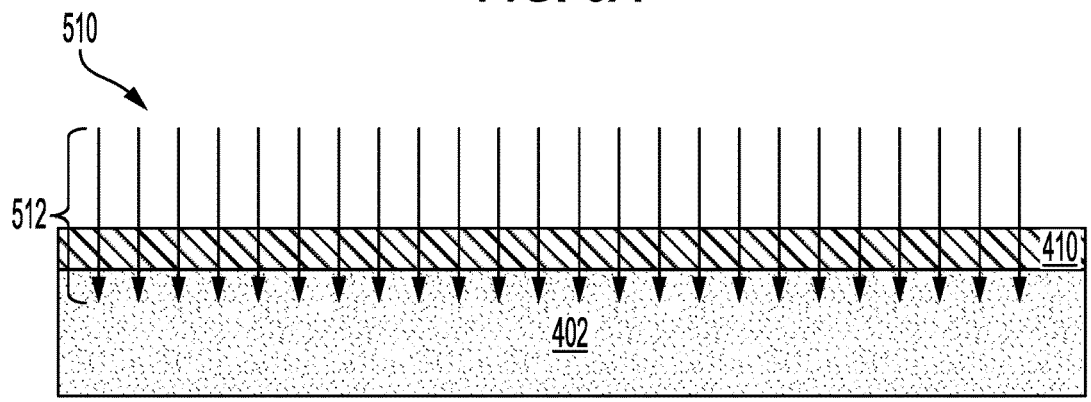

As shown in FIG. 5B, at step 510, a hydrogen implant 512 is performed through the bonding material 410 and into the semiconductor substrate 402, according to aspects of the present disclosure. In one configuration, a backside grinding process as well as an associated separation process are eliminated by forming a material separation layer, as shown in FIG. 5C.

Figure 5C:
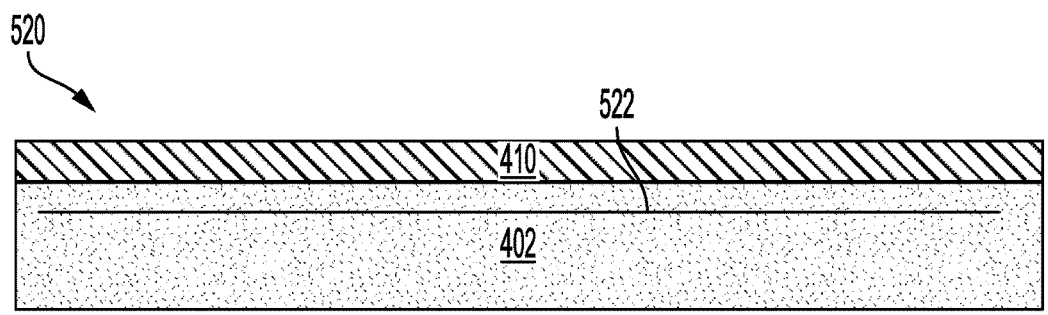
Figure 5D:
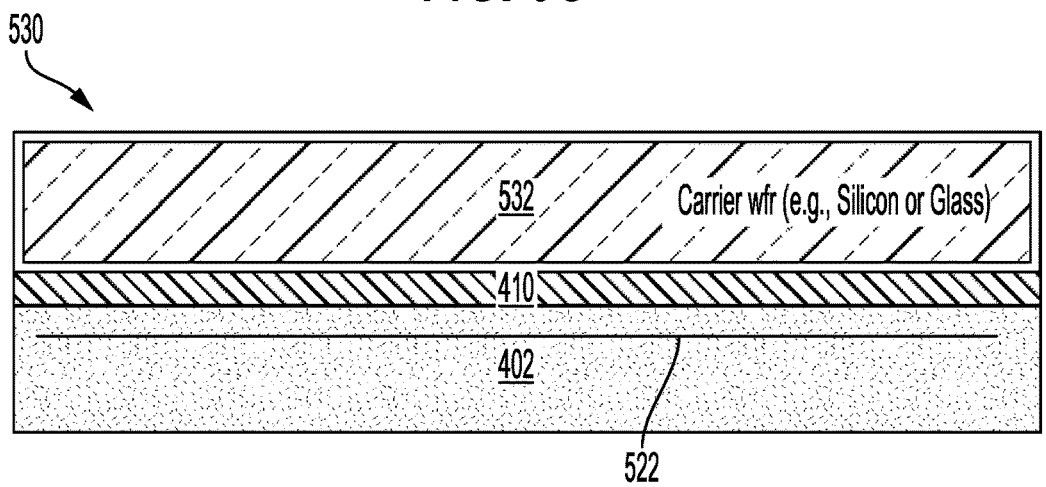

As shown in FIG. 5C, at step 520, an anneal process is performed, in which the semiconductor substrate 402 is subjected to a high temperature process for forming a material separation layer 522, according to aspects of the present disclosure. As shown in FIG. 5D, at step 530, a carrier wafer 532 (e.g., silicon, glass, etc.) is attached to the semiconductor substrate 402 using the bonding material 410, according to aspects of the present disclosure. In this aspect of the present disclosure, the carrier wafer 532 is incorporated to enable a modified layer-transfer process. This configuration enables precise control of a remaining front side thickness by using the material separation layer 522 to form the active layer 420, as shown in FIG. 5E.

Figure 5E:
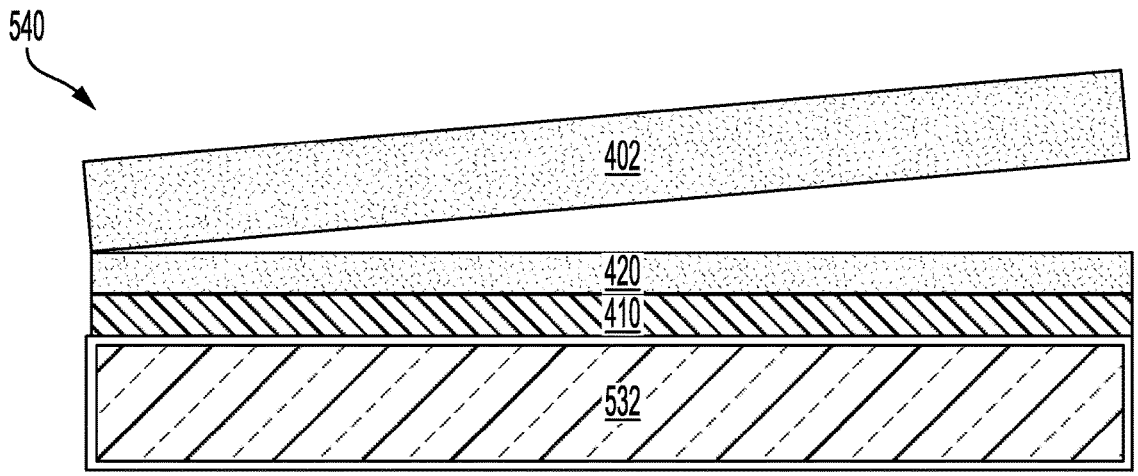
Figure 5F:
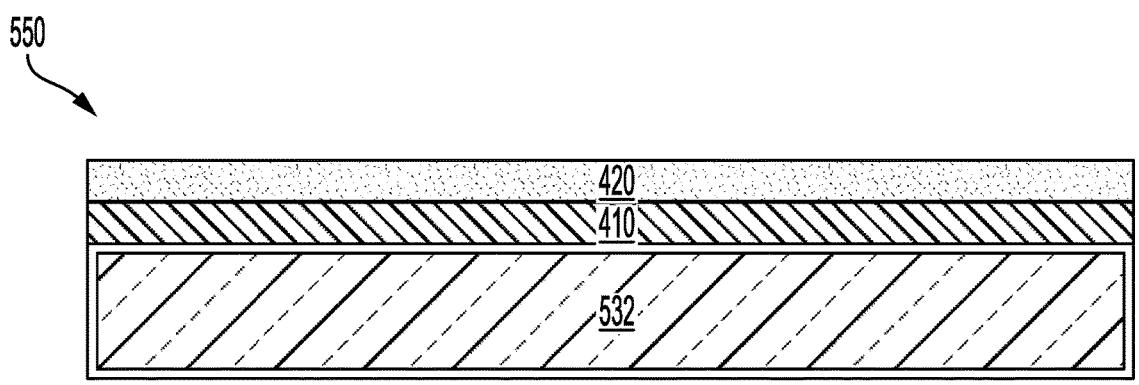

As shown in FIG. 5E, at step 540, a smart-cut process cuts the semiconductor substrate 402 at the material separation layer 522 according to aspects of the present disclosure. As shown in FIG. 5F, at step 550, a planarization process is performed on a surface of the active layer 420. The planarization process of step 550 enables precise control of a remaining front side thickness of the active layer 420, according to aspects of the present disclosure.

Figure 5G:
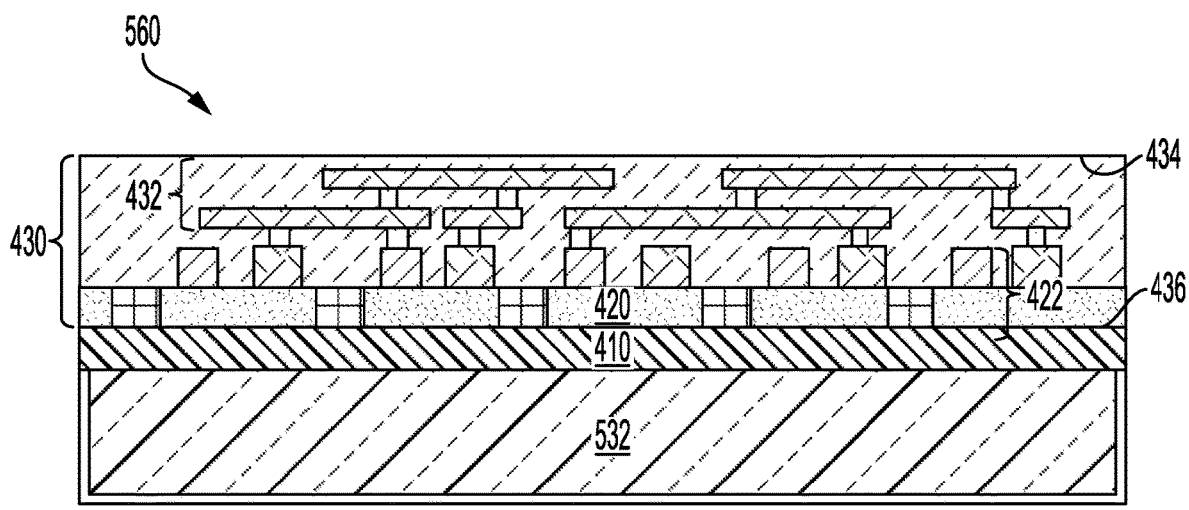

As shown in FIG. 5G, at step 560, a front side process is performed on the active layer 420 to form the logic die 430, according to aspects of the present disclosure. In this configuration, the logic die 430 is formed by fabricating the active devices 422 from the active layer 420. These active devices 422 may be transistors or other like device to implement the logic die 430. Once the active devices 422 are formed, the BEOL metallization structure 432 is formed to contact the active devices 422 to complete the logic die 430.

Figure 5H:
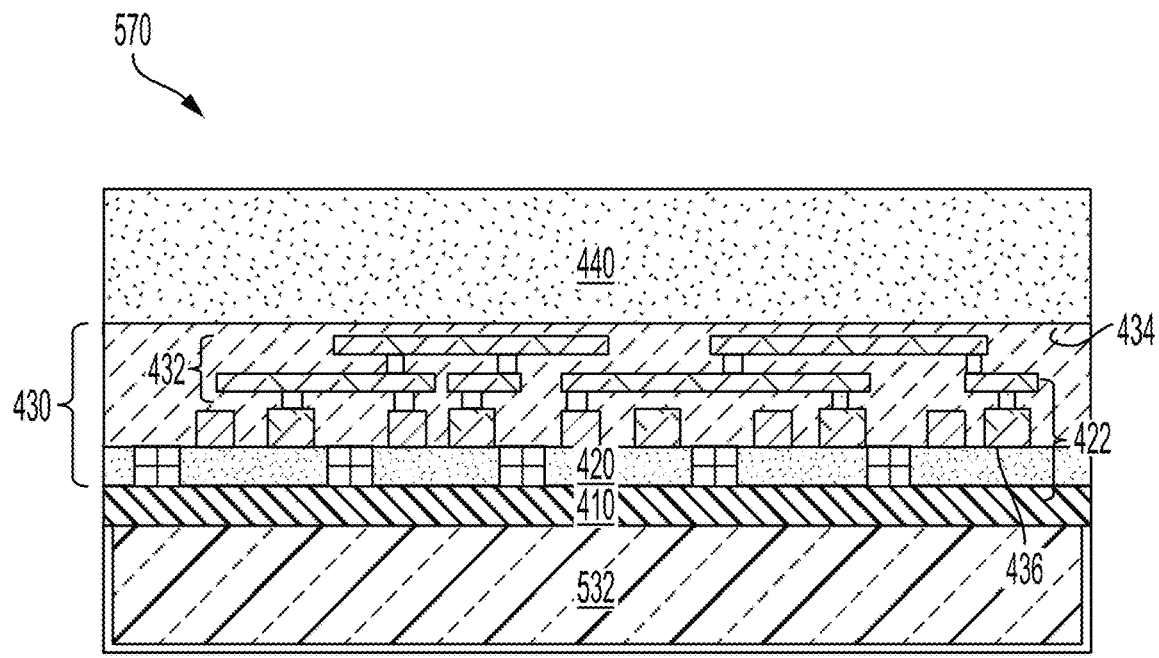
Figure 5I:
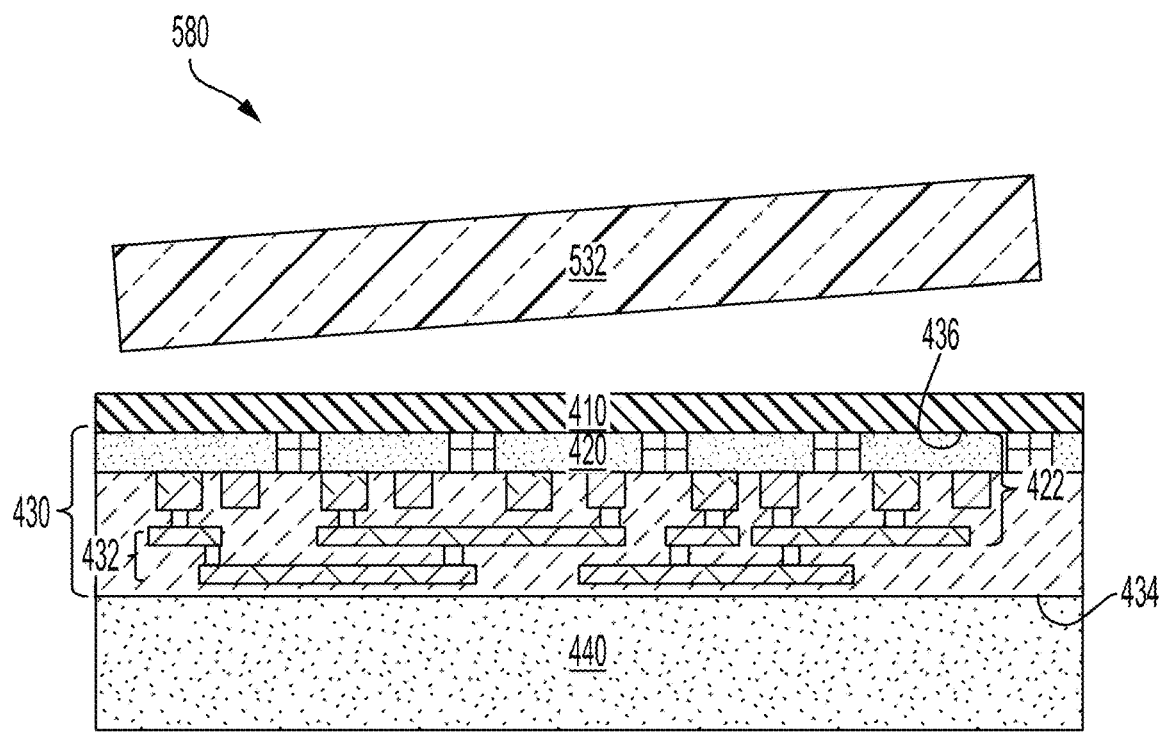
Figure 5J:
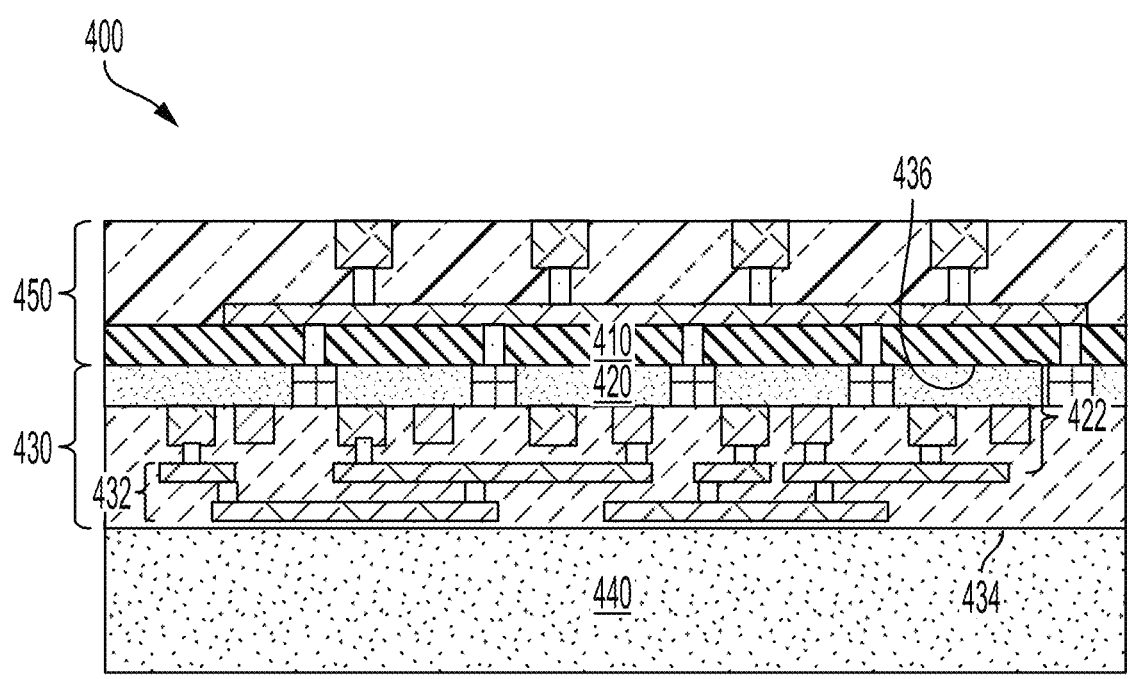

As shown in FIG. 5H, at step 570, a front side wafer 440 is coupled to a front side surface 434 of the logic die 430, according to aspects of the present disclosure. As shown in FIG. 5I, at step 580, the carrier wafer 532 is de-bonded from a surface of the bonding material 410, according to aspects of the present disclosure. This aspect of the present disclosure applies a temporary bonding process and a layer-transfer process to both a front side and a backside of the IC package 400 to enable device integration in a sequential process flow. As shown in FIG. 5J, a backside process is performed on the bonding material 410 to form the backside power delivery network 450 and complete the IC package 400, according to aspects of the present disclosure.

FIGS. 6A-6L are cross-sectional diagrams illustrating a process of fabricating the IC package 460 of FIG. 4B, having an oxide layer as a dielectric material for a first layer of a backside process, according to aspects of the present disclosure. In this example, FIGS. 6A-6I, illustrating steps 600-680, are similar to FIGS. 5A-5I, illustrating steps 500-580 and, therefore, their descriptions are not repeated for sake of brevity.

Figure 6A:
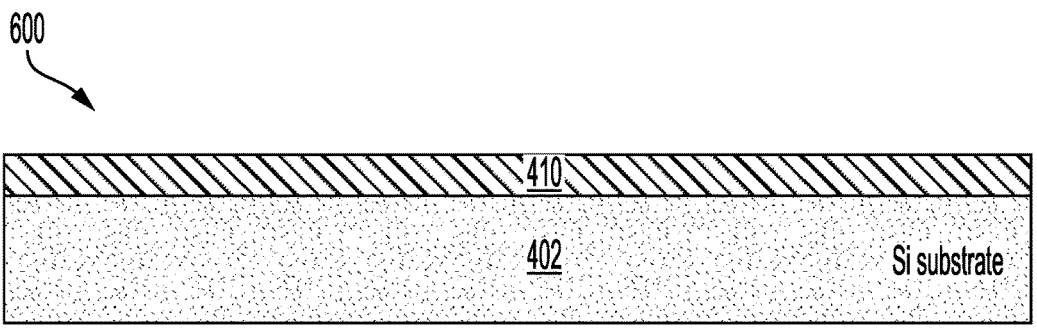
FIGS. 6A-6L are cross-sectional diagrams illustrating a process of fabricating the integrated circuit (IC) package of FIG. 4B, having an oxide layer as a dielectric material for a first layer of a backside process, according to aspects of the present disclosure.
Figure 6B:
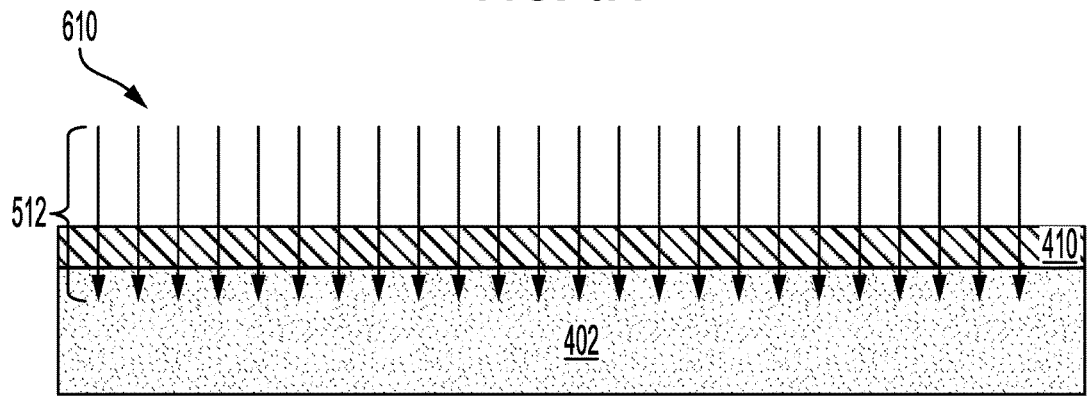
Figure 6C:
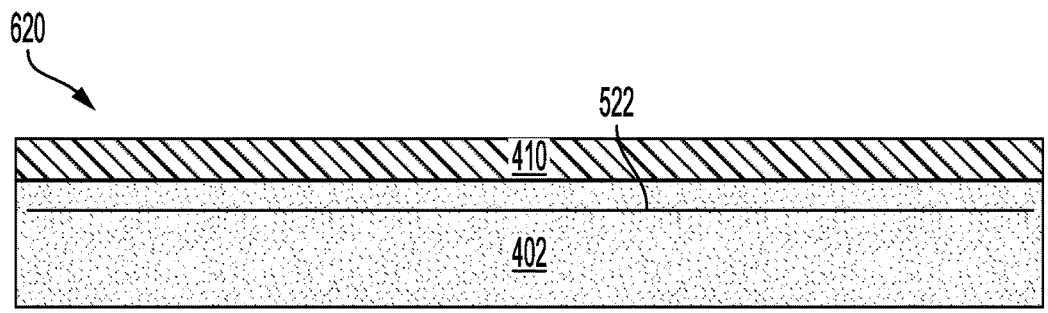
Figure 6D:
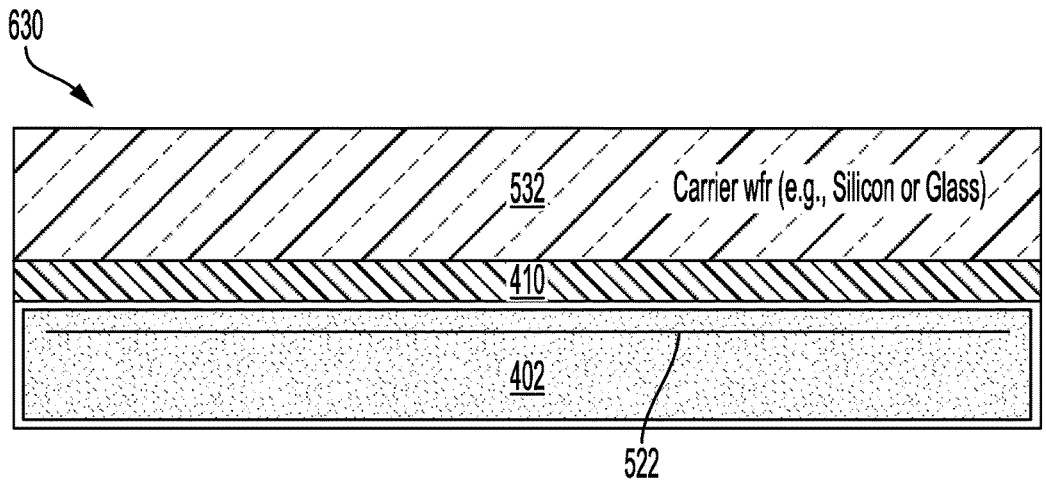
Figure 6E:
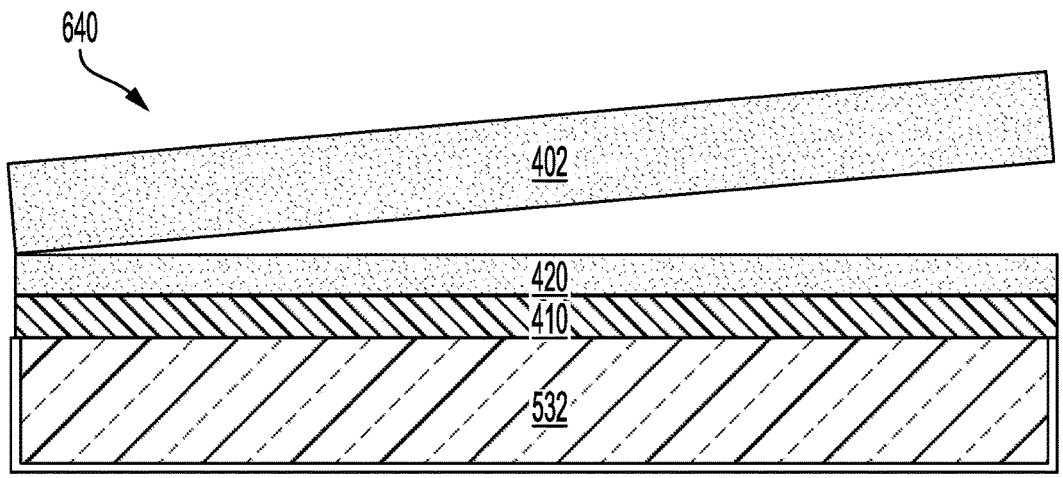
Figure 6F:
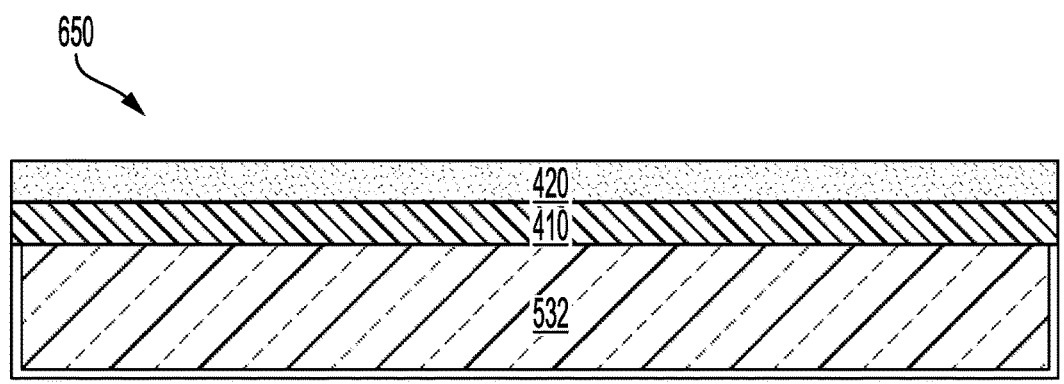
Figure 6G:
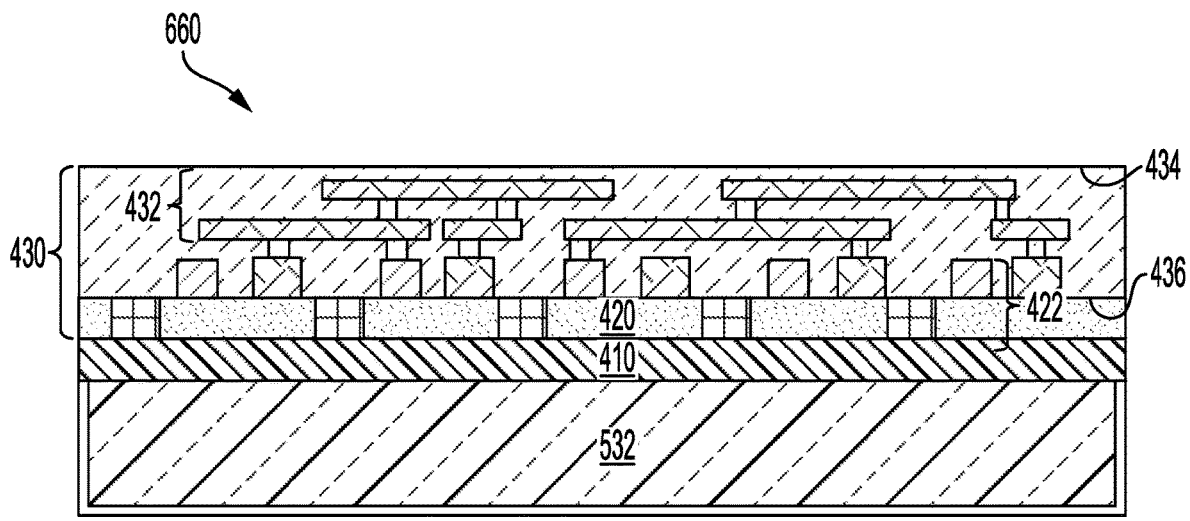
Figure 6H:
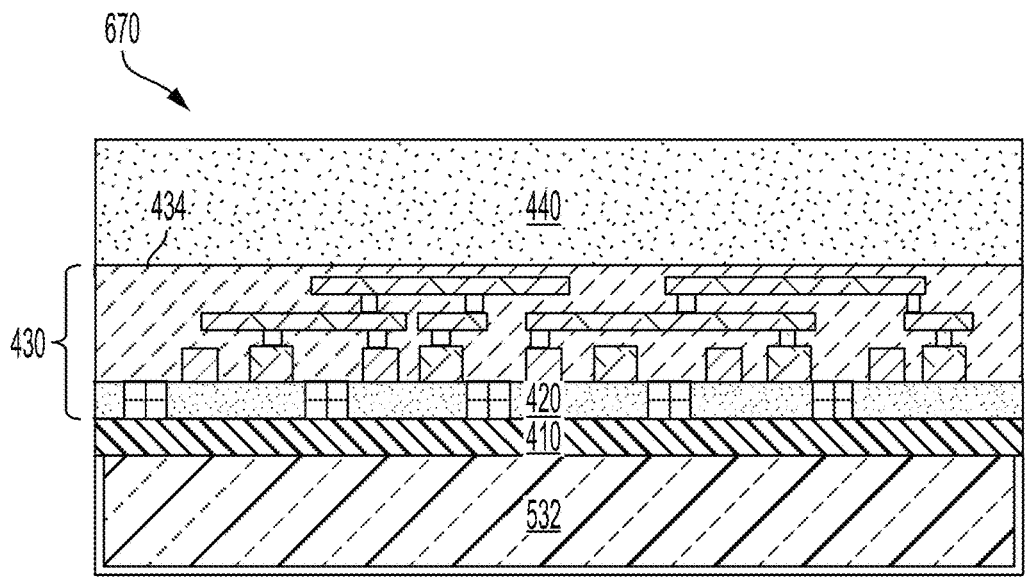
Figure 6I:
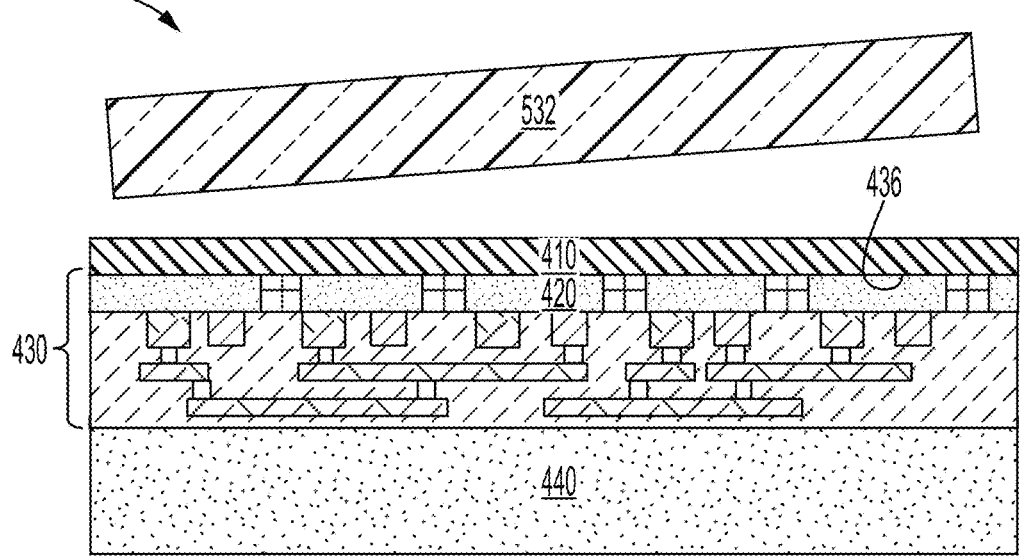
Figure 6J:
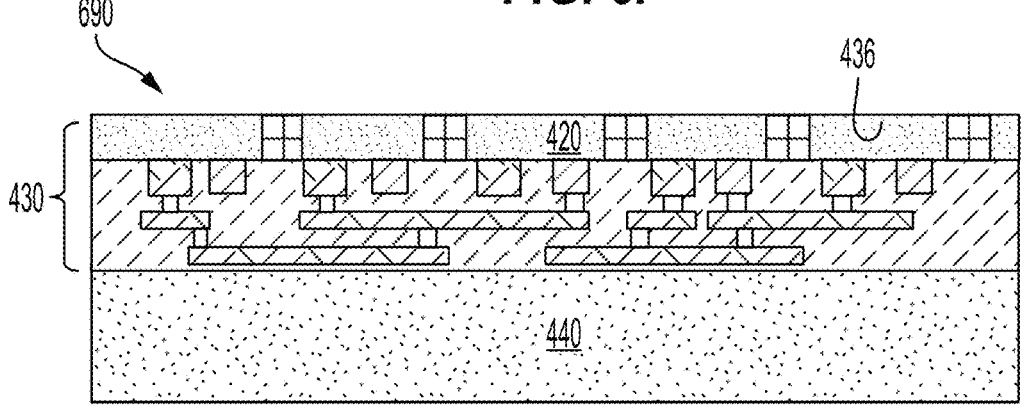
Figure 6K:
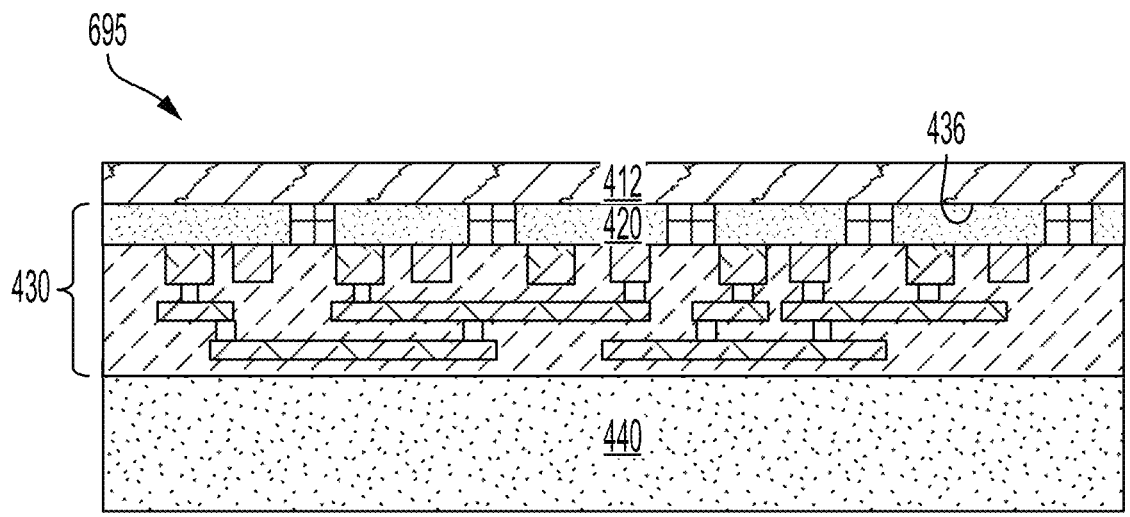
Figure 6L:
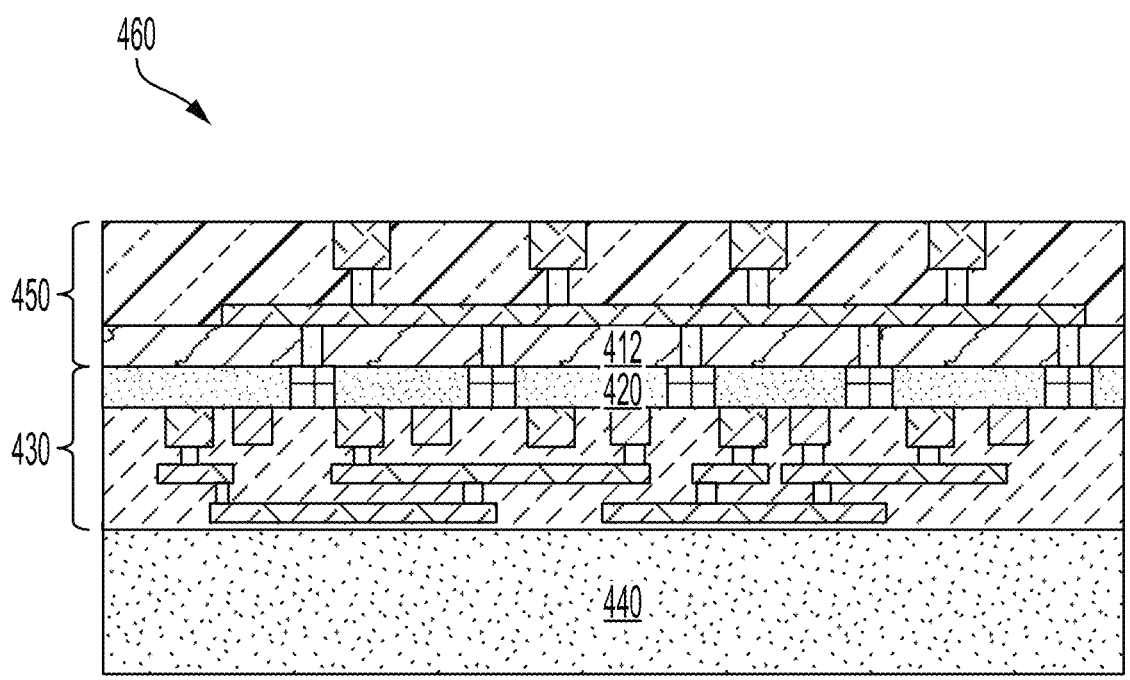

As shown in FIG. 6J, at step 690, the bonding material 410 is removed to expose a surface of the active layer 420 at the backside 436 of the logic die 430 using a cleaning process, according to aspects of the present disclosure. As shown in FIG. 6K, at step 695, an oxide material 412 is deposited on the surface of the active layer 420 at the backside 436 of the logic die 430, according to aspects of the present disclosure. As shown in FIG. 6L, a backside process is performed on the oxide material 412 to form the backside power delivery network 450 and complete the IC package 460, according to aspects of the present disclosure.

In aspects of the present disclosure, a smart-cut process (see FIGS. 5E/6E) is performed using the bonding material 410 and/or the oxide material 412 on a surface of the active layer 420. This process flow includes temporary bonding the carrier wafer 532 to a backside of the semiconductor substrate using the bonding material 410. The carrier wafer 532 may be a conventional semiconductor (e.g., silicon (Si)) substrate or a glass substrate.

As shown in FIGS. 5E-5F/6E-6F, after the smart-cut and temporary carrier process is complete, a front side process is performed using a conventional process flow to form the logic die 430. In addition, a de-bonding process is performed using a chemical/thermal/mechanical method to remove the carrier wafer 532, as shown in FIGS. 5H/6H. In addition, a laser process may be performed when using a glass carrier wafer. In one configuration, the front side wafer 440 is bonded before performing the de-bonding process to the remove carrier wafer 532 from the bonding material 410. In some configurations, the front side wafer 440 may be a dummy carrier wafer to provide mechanical strength and/or a functional wafer (e.g., memory die, etc.). A backside process is next performed with or without removing the bonding material 410 on the backside 436 of the logic die 430.

FIGS. 7A-7L are cross-sectional diagrams illustrating an alternate process of fabricating the IC package 460 of FIG. 4B, having a logic die integrated with a backside power delivery network and a front side wafer, according to aspects of the present disclosure.

Figure 7A:
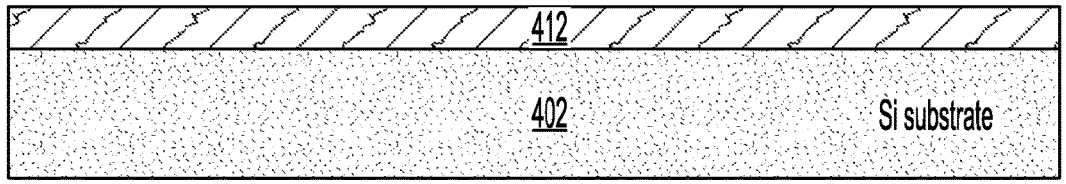
FIGS. 7A-7L are cross-sectional diagrams illustrating an alternate process of fabricating the integrated circuit (IC) package of FIG. 4B, having a logic die integrated with a backside power delivery network and a front side wafer, according to aspects of the present disclosure.

As shown in FIG. 7A, at step 700, an oxide material 412 is deposited on a surface of a semiconductor substrate 402, according to an aspect of the present disclosure. In this example, the oxide material 412 is composed of an organic/ inorganic material. In one aspect of the present disclosure, the oxide material 412 provides a dielectric material for a first layer of the backside power delivery network 450. The front side wafer 440 may be initially diced from a wafer of memory dies and cleaned before attachment to the front side surface 434 of the logic die 430, as shown below in FIG. 7I.

Figure 7B:
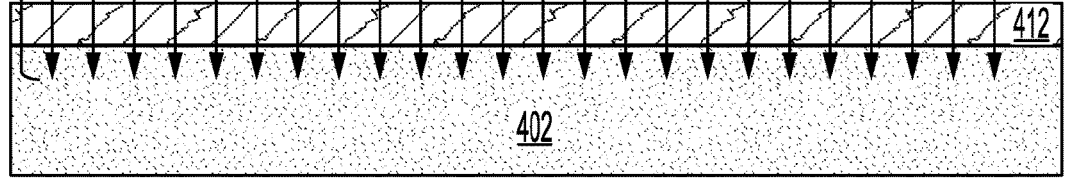

As shown in FIG. 7B, at step 710, a hydrogen implant 712 is performed through the oxide material 412 and into the semiconductor substrate 402, according to aspects of the present disclosure. In one configuration, a backside grinding process as well as an associated separation process are eliminated by using a material separation layer, as shown in FIG. 7C.

Figure 7C:
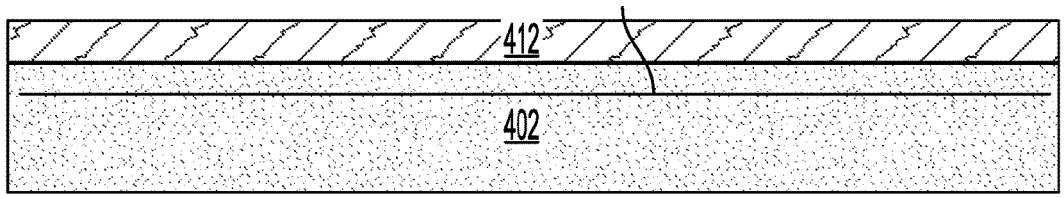
Figure 7D:
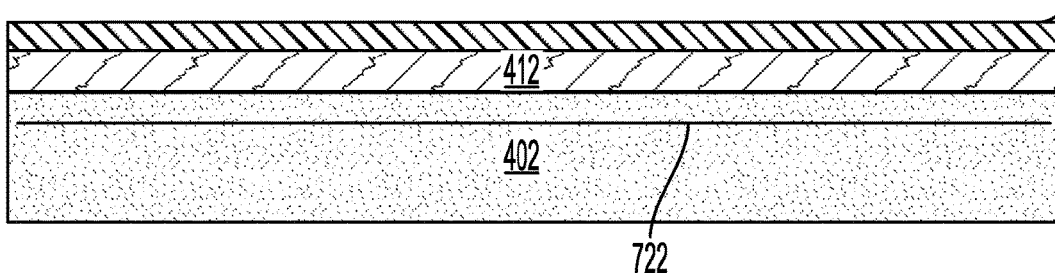

As shown in FIG. 7C, at step 720, an anneal process is performed, in which the semiconductor substrate 402 is subjected to a high temperature process for forming a material separation layer 722, according to aspects of the present disclosure. As shown in FIG. 7D, at step 730, a temporary bonding material 732 is deposited on a surface of the oxide material 412, according to an aspect of the present disclosure.

Figure 7E:
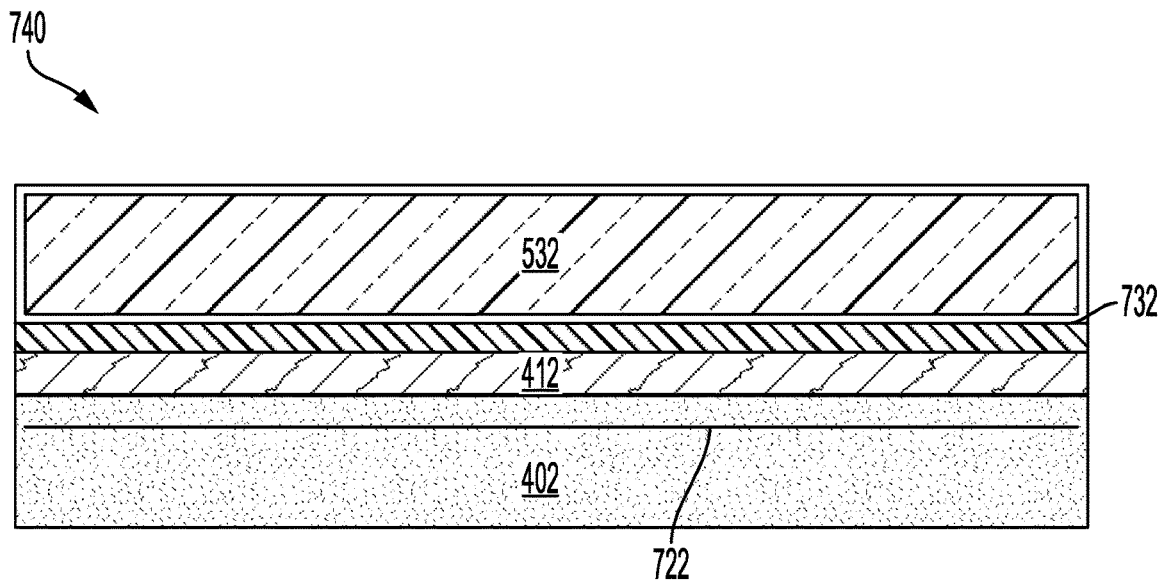

As shown in FIG. 7E, at step 740, the carrier wafer 532 (e.g., silicon, glass, etc.) is attached to the semiconductor substrate 402 using the temporary bonding material 732, according to aspects of the present disclosure. In this aspect of the present disclosure, the carrier wafer 532 is incorporated to enable a modified layer-transfer process to incorporate the front side wafer 440, as shown below in FIG. 7J. This configuration enables precise control of a remaining front side thickness by using the material separation layer 722 to form the active layer 420, as shown in FIG. 7F.

Figure 7F:
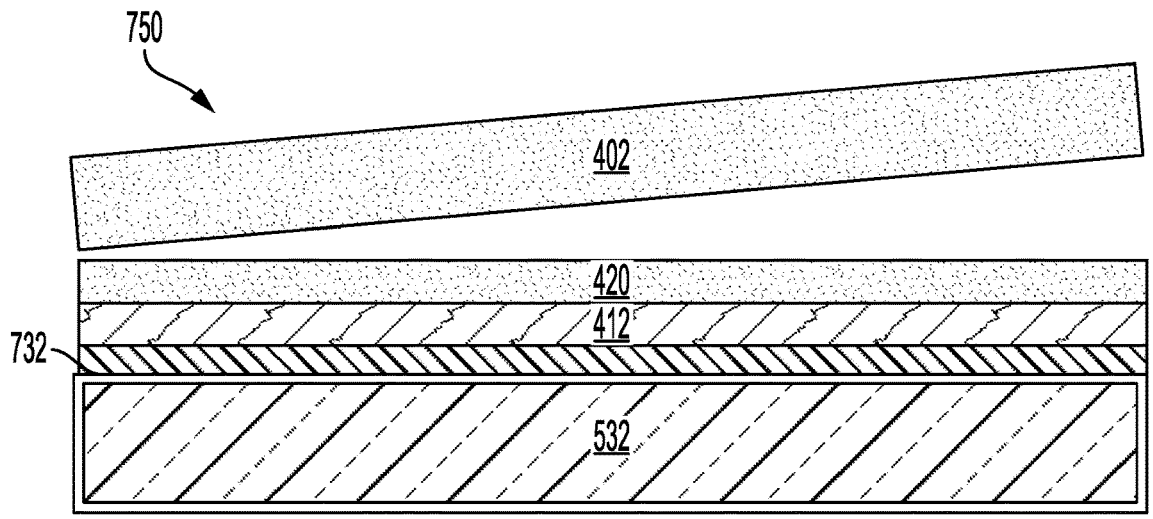
Figure 7G:
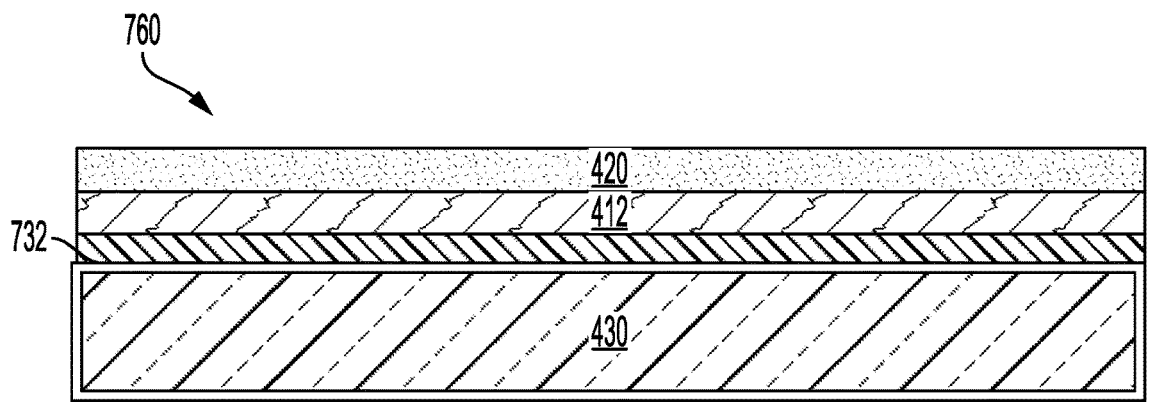

As shown in FIG. 7F, at step 750, a smart-cut process cuts the semiconductor substrate 402 at the material separation layer 722 according to aspects of the present disclosure. As shown in FIG. 7G, at step 760, a planarization process is performed on a surface of the active layer 420. The planarization process of step 760 enables precise control of a remaining front side thickness of the active layer 420, according to aspects of the present disclosure.

Figure 7H:
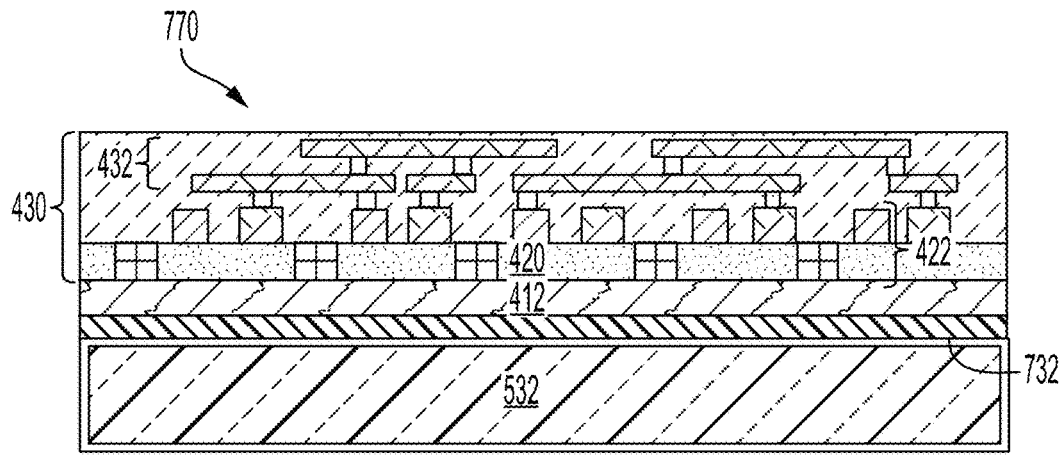

As shown in FIG. 7H, at step 770, a front side process is performed on the active layer 420 to form the logic die 430, according to aspects of the present disclosure. In this configuration, the logic die 430 is formed by fabricating the active devices 422 from the active layer 420. These active devices 422 may be transistors or other like devices to implement the logic die 430. Once the active devices 422 are formed, the BEOL metallization structure 432 is formed to contact the active devices 422 to complete the logic die 430.

Figure 7I:
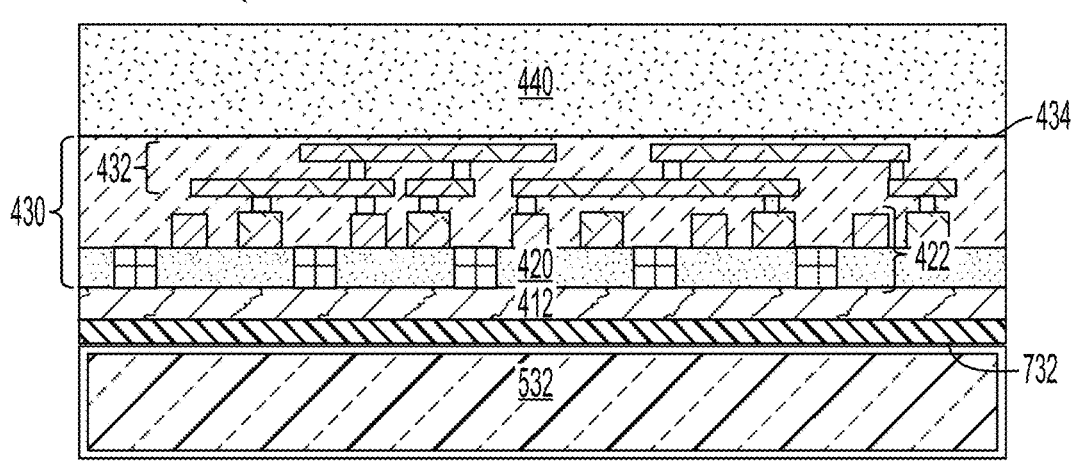
Figure 7J:
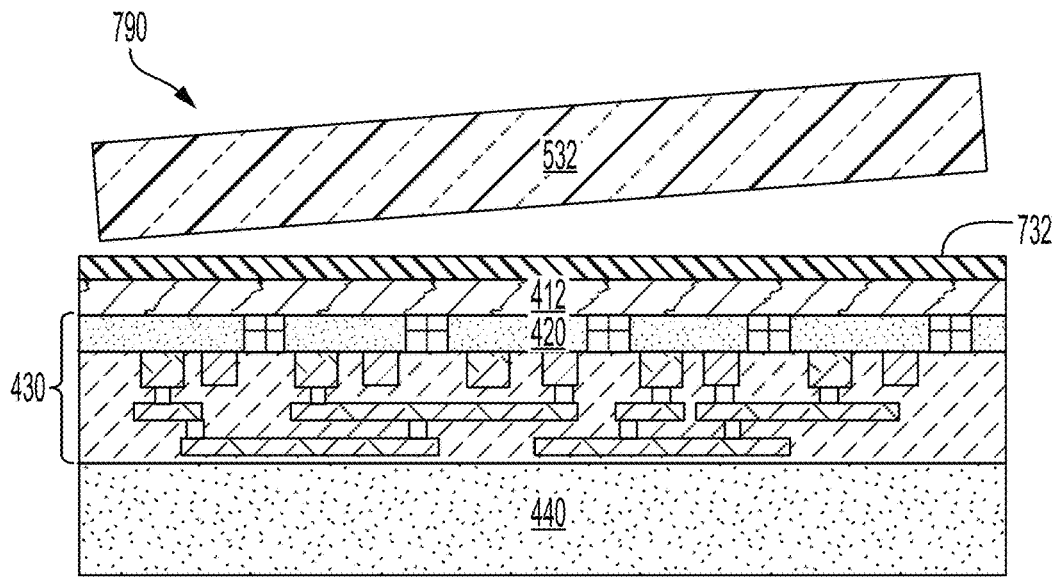

As shown in FIG. 7I, at step 780, the front side wafer 440 is coupled to a front side surface 434 of the logic die 430, according to aspects of the present disclosure. As shown in FIG. 7J, at step 790, the carrier wafer 532 is de-bonded from a surface of the temporary bonding material 732, according to aspects of the present disclosure. This aspect of the present disclosure applies a temporary bonding process and a layer-transfer process to both a front side and a backside of the IC package 460 to enable device integration in a sequential process flow.

Figure 7K:
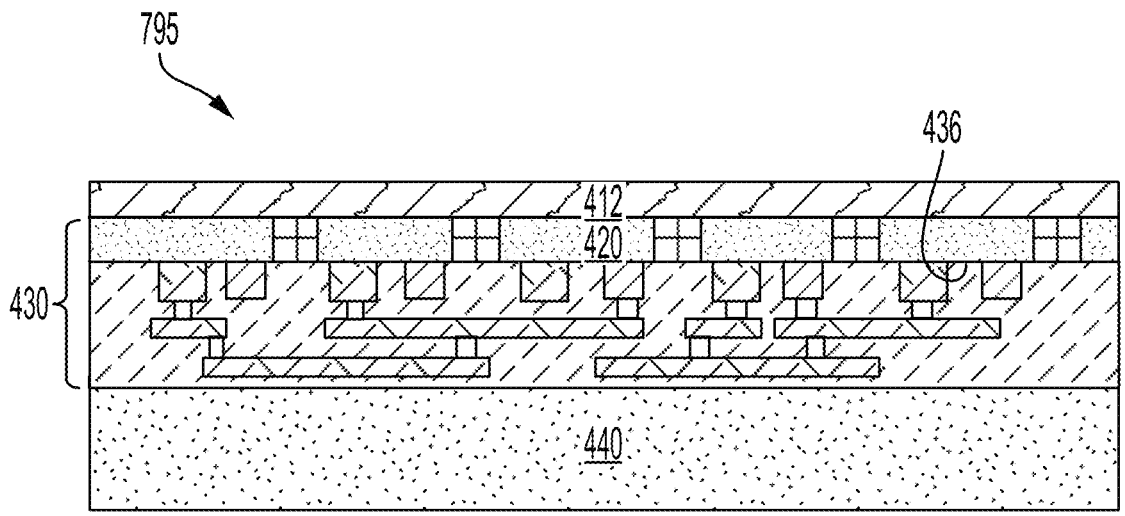
Figure 7L:
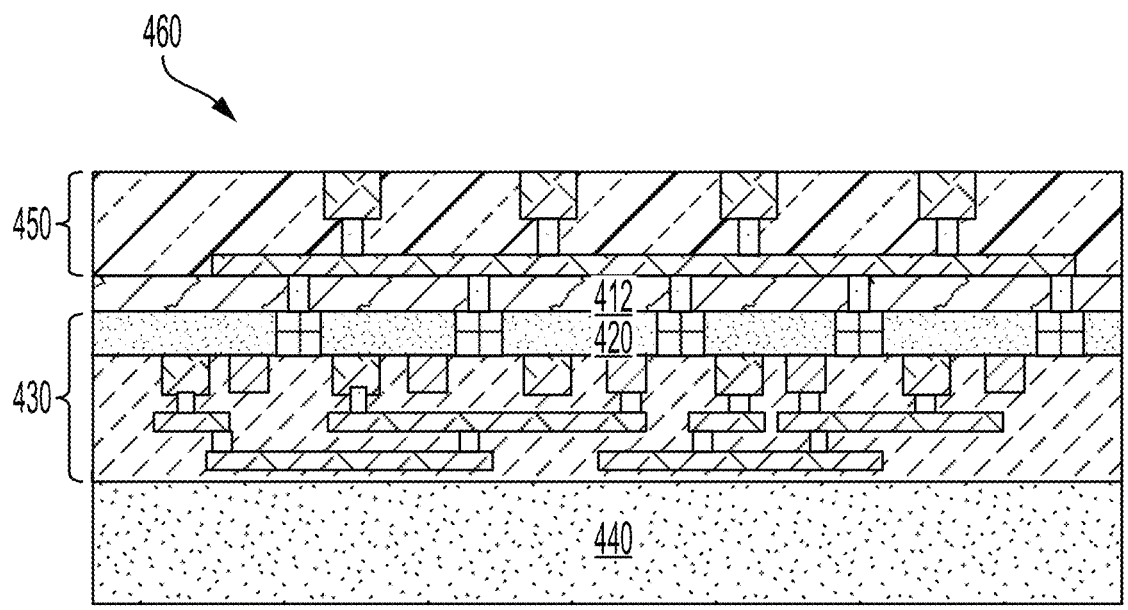

As shown in FIG. 7K, at step 795, the temporary bonding material 732 is removed to expose a surface of the oxide material 412 on the backside 436 of the logic die 430 using a cleaning process, according to aspects of the present disclosure. As shown in FIG. 7L, a backside process is performed on the oxide material 412 to form the backside power delivery network 450 and complete the IC package 460, according to aspects of the present disclosure.

Figure 8:
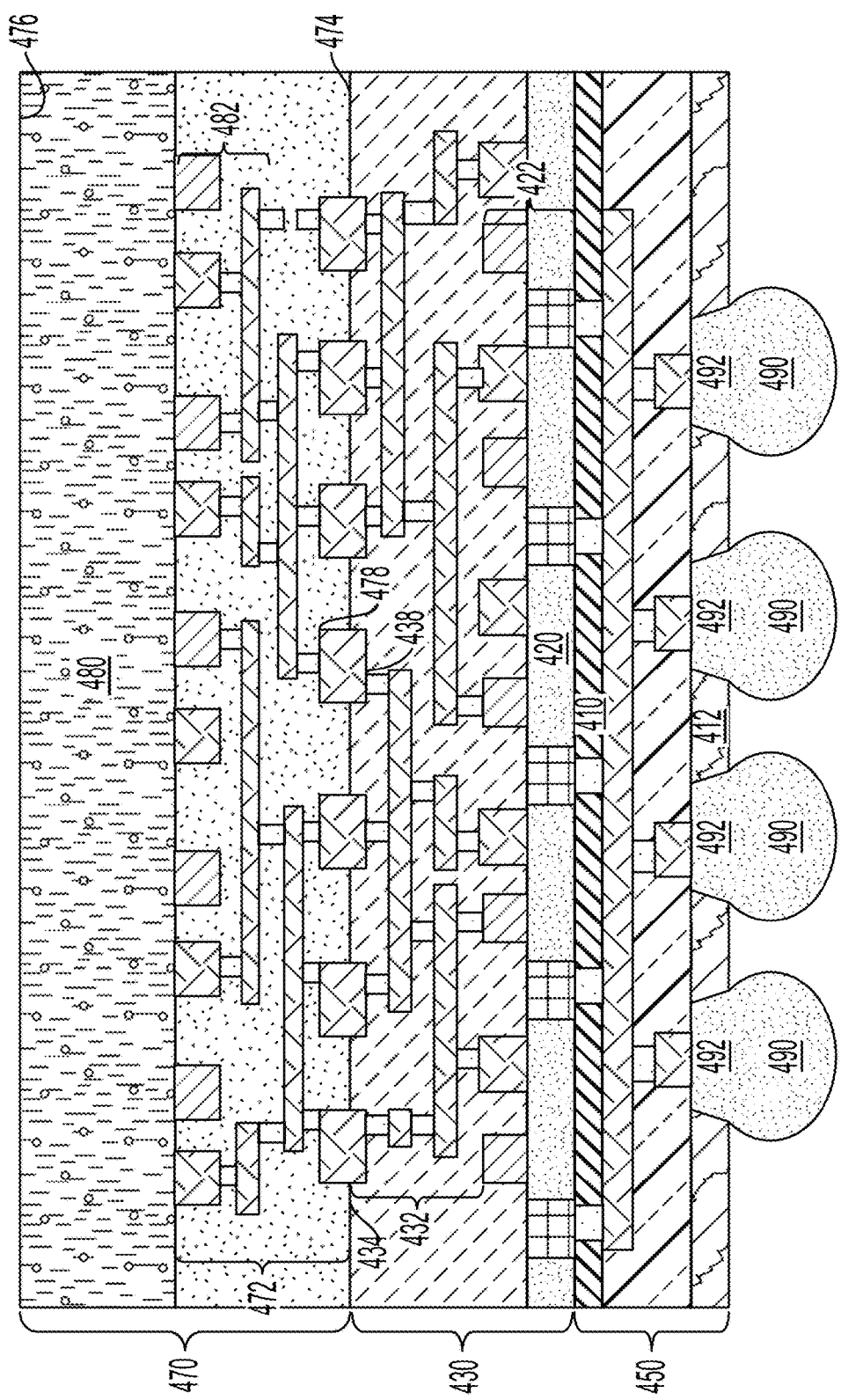
FIG. 8 illustrates a 3D integrated circuit (IC) device, having a logic die, a backside power delivery network, and a memory die, according to aspects of the present disclosure.

FIG. 8 illustrates a 3D integrated circuit (IC) device 800, having the logic die 430, the backside power delivery network 450, and a memory die 470, according to aspects of the present disclosure. FIGS. 9A-9N are cross-sectional diagrams illustrating a process of fabricating the 3D IC device 800 of FIG. 8, having the logic die 430 (e.g., a first die) integrated with the backside power delivery network 450, and a memory die 470 (e.g., a second die), according to aspects of the present disclosure. The process of fabricating the 3D IC device 800 of FIG. 8 includes previously described components, such as the logic die 430 and the backside power delivery network 450, which are shown with similar reference numbers. Although shown as a memory die, it should be recognized that the memory die 470 may be another device, such as a lower performance die. In this example, a performance level of the logic die 430 is greater than the performance level of the memory die 470.

This aspect of the present disclosure performs a backside process before performing a front side process to fabricate the backside power delivery network 450 of the 3D IC device 800. Beneficially, the backside power delivery network 450 is formed before a front side process and a layer-transfer process are applied to both a front side and a backside of the 3D IC device 800. That is, formation of the backside power delivery network 450 before the front side process enables integration of thermally sensitive devices, such as the memory die 470, for example, according to the process flow shown in FIGS. 9A-9N.

In this example, FIGS. 9A-9C, illustrating steps 900-920 are similar to FIGS. 7A-7C, illustrating steps 500-520 and, therefore, their descriptions are not repeated for sake of brevity. As shown in FIG. 9D, at step 930, a clean process is applied to the oxide material 412 to expose the active layer 420 of the semiconductor substrate 402, including a material separation layer 922, according to aspects of the present disclosure.

As shown in FIGS. 9E and 9F, at steps 905 and 915, the oxide material 412 is deposited on a surface of the carrier wafer 532, according to an aspect of the present disclosure. As shown in FIG. 9G, at step 925, a backside process is performed on the oxide material 412 to form the backside power delivery network 450 and complete the IC package 460, according to aspects of the present disclosure. In addition, the bonding material 410 provides a dielectric material as a first layer of the backside power delivery network 450. The layer-transfer process shown in FIG. 9H is enabled by the bonding material 410 on a surface of the backside power delivery network 450.

As shown in FIG. 9H, at step 940, a layer-transfer process bonds the active layer 420 of the semiconductor substrate 402 to the bonding material 410 of the backside power delivery network 450, in one aspect of the present disclosure. In this aspect of the present disclosure, a backside process is completed prior to bonding to a front side wafer and before the smart-cut process, for example, as shown in FIG. 9L.

Figure 9I:
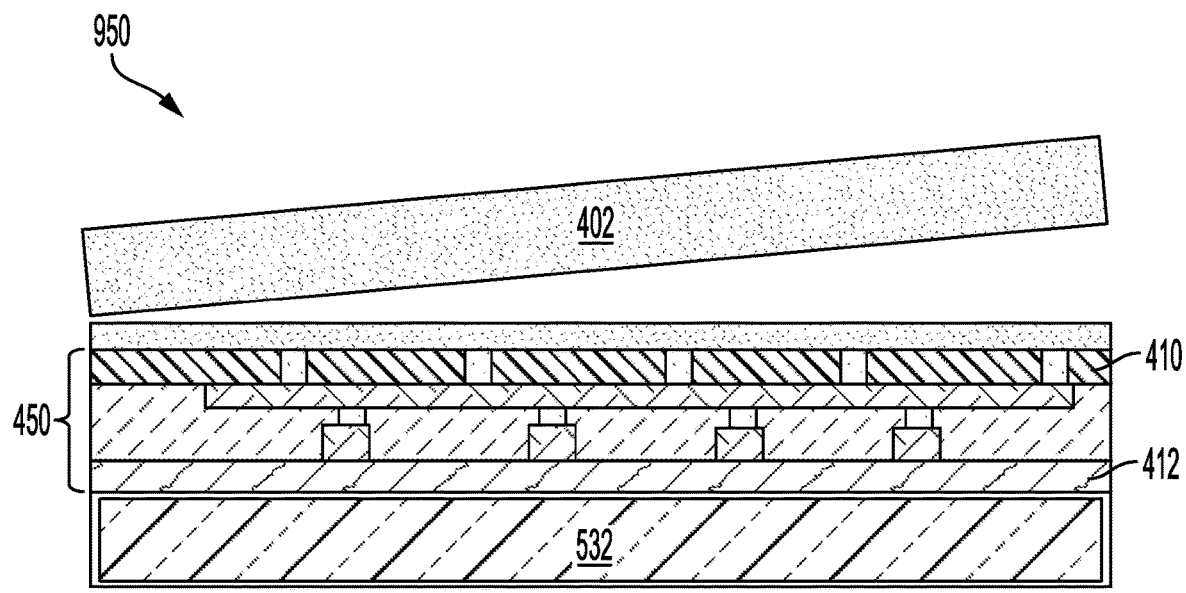
FIGS. 9A-9N are cross-sectional diagrams illustrating a process of fabricating the 3D integrated circuit (IC) device of FIG. 8, having the logic die integrated with a backside power delivery network, and a front side memory die, according to aspects of the present disclosure.
Figure 9J:
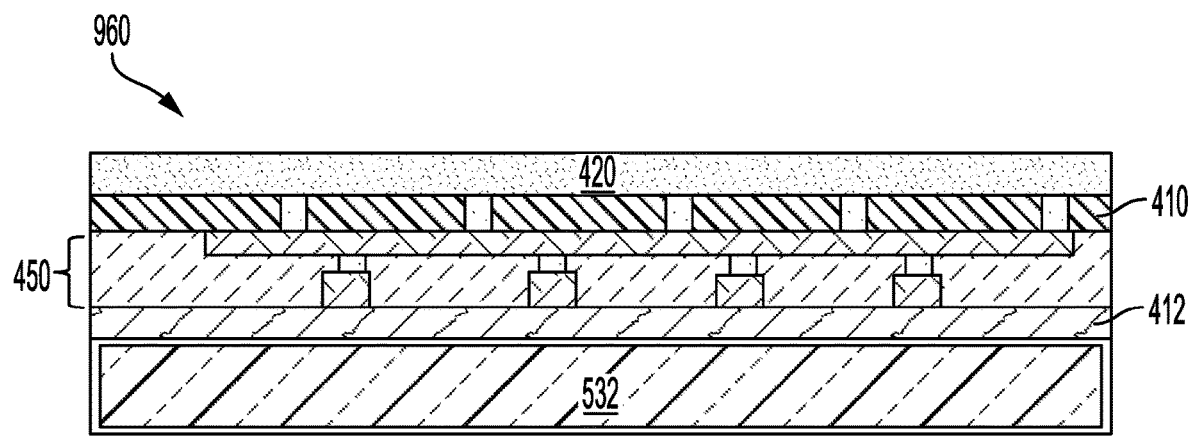

As shown in FIG. 9I, at step 950, a smart-cut process is performed to cut the semiconductor substrate 402 at the material separation layer 922, according to aspects of the present disclosure. As shown in FIG. 9J, at step 960, a planarization process is performed on a surface of the active layer 420. The planarization process of step 960 enables precise control of a remaining front side thickness of the active layer 420, according to aspects of the present disclosure. After the smart-cut and planarization processes are completed, a front side process is performed using the active layer 420, as shown in FIG. 9K.

Figure 9K:
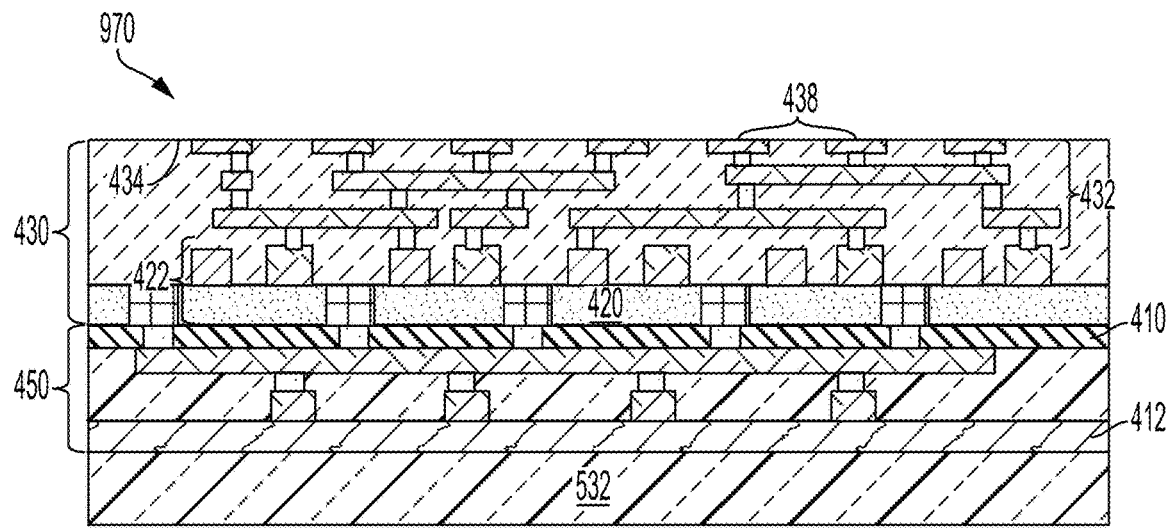

As shown in FIG. 9K, at step 970, a front side process is performed on the active layer 420 to form the logic die 430, according to aspects of the present disclosure. In this configuration, the logic die 430 is formed by fabricating the active devices 422 (e.g., first active devices) from the active layer 420. These active devices 422 may be transistors or other like devices to implement the logic die 430. Once the active devices 422 are formed, the BEOL metallization structure 432 (e.g., a first BEOL metallization structure) is formed to couple the active devices 422 to contact pads 438 (e.g., first contact pads) to complete the logic die 430. In this configuration, the BEOL metallization structure 432 includes metal routing layers within multiple dielectric layers and composed of interconnects (e.g. pads, vias, metal layers, and/or traces).

Figure 9L:
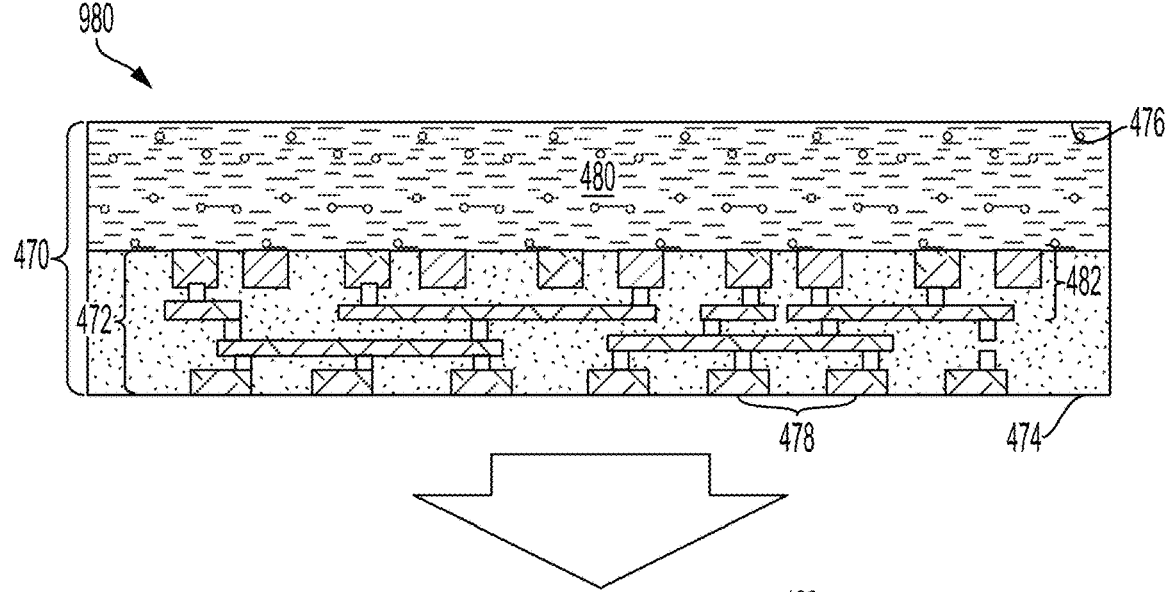
Figure 9L:
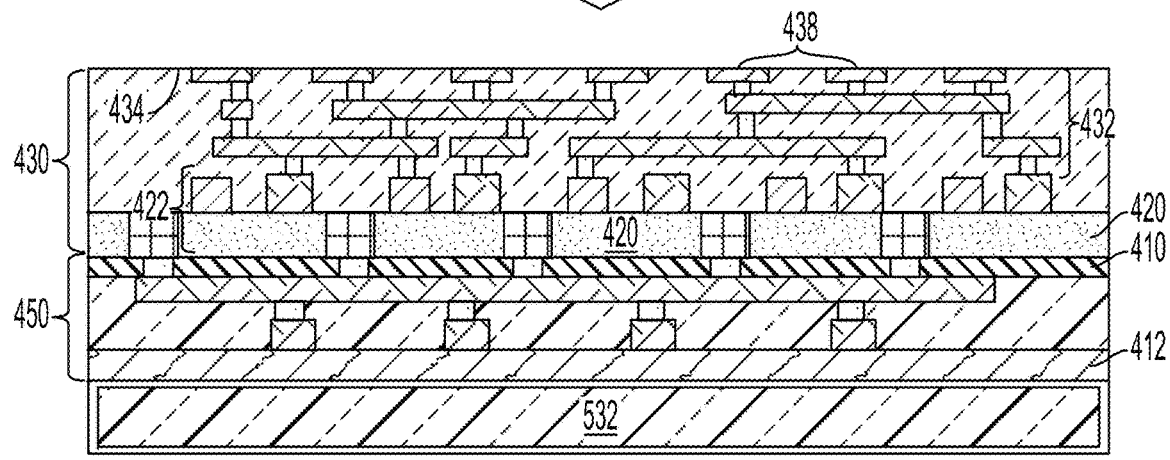

As shown in FIG. 9L, at step 980, a front side surface 474 of a memory die 470 is bonded to the front side surface 434 of the logic die 430, according to aspects of the present disclosure. In this configuration, the memory die 470 may include a wafer 480, having active devices 482 (e.g., second active devices) formed on the wafer 480. In this example, the active devices 482 are coupled to a BEOL metallization structure 472 (e.g., a second BEOL metallization structure) and contact pads 478 (e.g., second contact pads) at the front side surface 474 distal from a backside surface 476 of the memory die 470. In addition, the contact pads 478 of the memory die 470 are coupled to contact pads 438 of the logic die 430. In another configuration, the memory die 470 is a temporary carrier wafer bonded on the front side surface 434 of the logic die 430 to remove the carrier wafer 532 and reveal the oxide material 412 of the backside power delivery network 450, as shown in FIG. 9M.

Figure 9M:
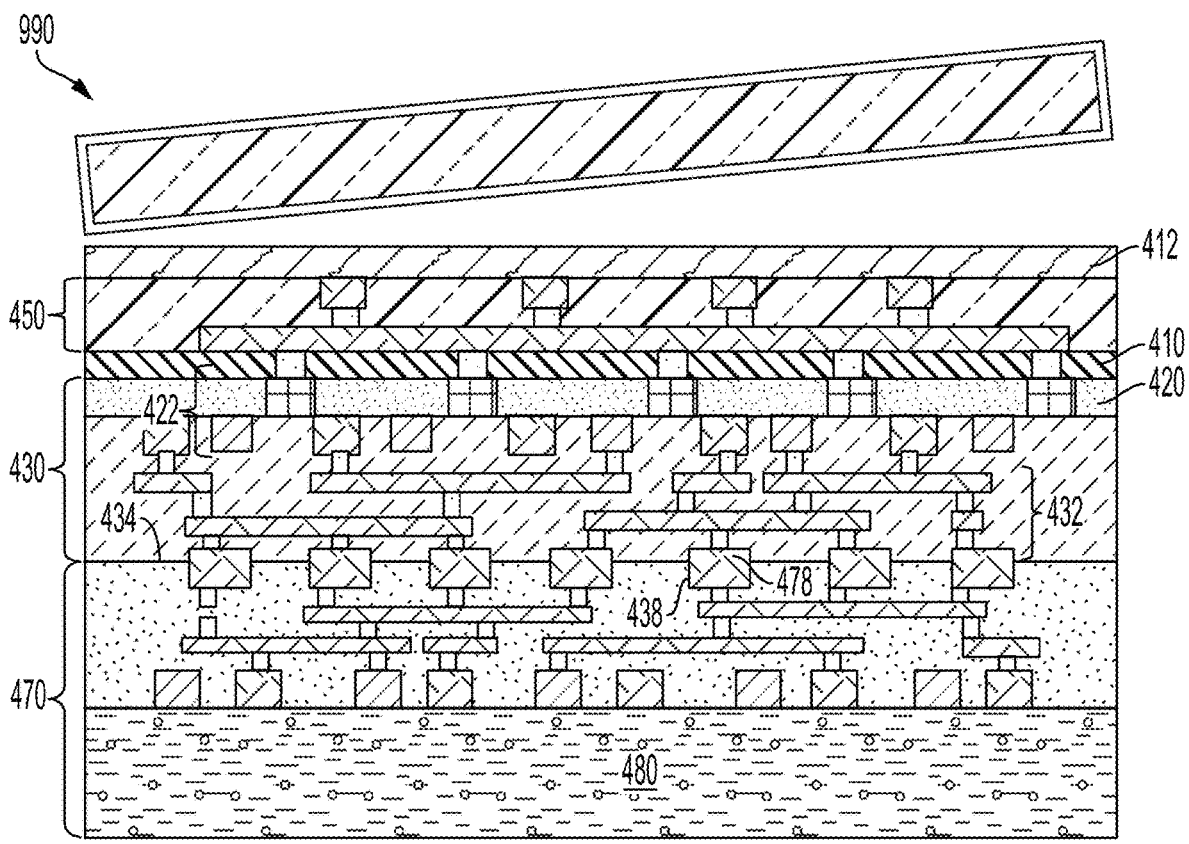
Figure 9N:
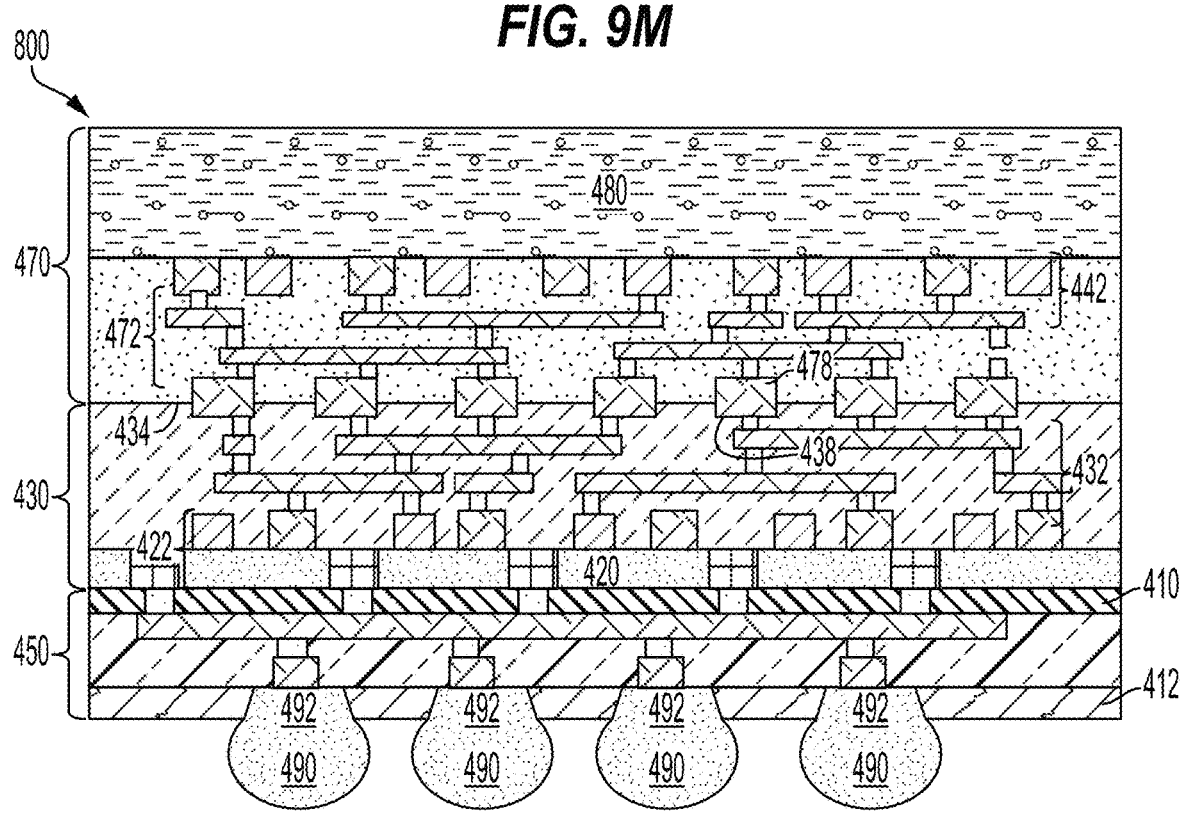

As shown in FIG. 9M, at step 990, the carrier wafer 532 is de-bonded from a surface of the oxide material 412 (e.g., a second surface or a backside surface) of the backside power delivery network, according to aspects of the present disclosure. In addition, the memory die 470 is integrated on the front side surface 434 of the logic die 430 to form the 3D IC device 800. In this configuration, the memory die 470 is integrated with the logic die 430 and the backside power delivery network 450, as shown in FIG. 9N. As further illustrated in FIG. 9N, package balls 490 are formed on pads 492 within the oxide material 412 for coupling to the backside power delivery network 450 to complete formation of the 3D IC device 800.

In this aspect of the present disclosure, backside processing is performed before front side processing to support integration of thermally sensitive devices (e.g., the memory die 470). Concurrent with the backside processing, the material separation layer 922 enables precise backside material (e.g., semiconductor substrate 402) removal to form the active layer 420. These processes concurrently form the backside power delivery network 450 and prepare the semiconductor substrate 402 before a front side process fabricates the logic die 430.

The 3D IC device 800 integrates the memory die 470, which is subsequently formed to avoid thermal damage from the previous concurrent processing. One aspect of the present disclosure relies on a high temperature compatible metallization (e.g., tungsten (W), ruthenium (Ru), etc.) to form the backside power delivery network 450 and/or the BEOL metallization structure 432 or the BEOL metallization structure 472. As a result, the memory die 470 may be a thermally sensitive device, such as a dynamic random access memory (DRAM).

Figure 10:
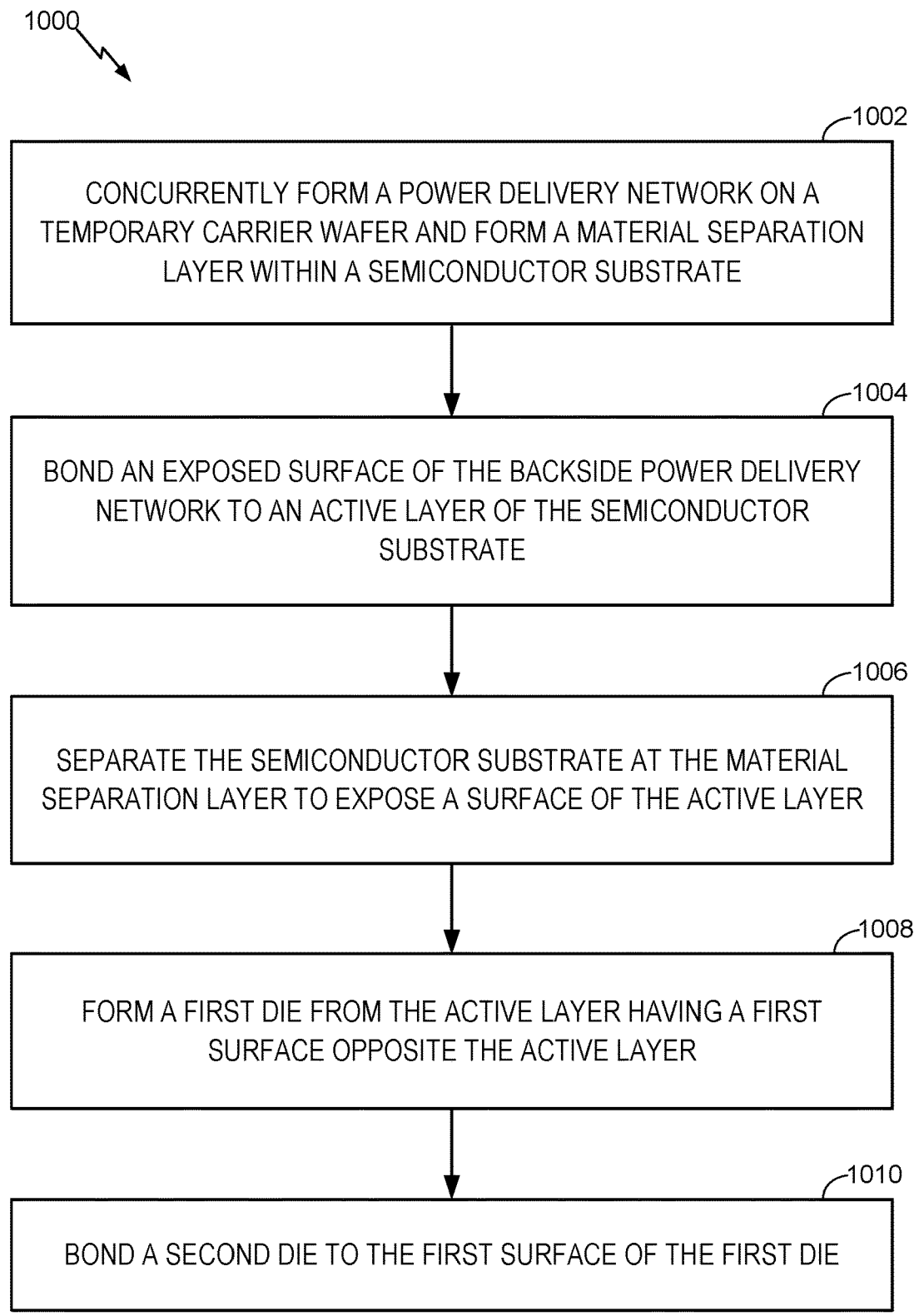
FIG. 10 is a process flow diagram illustrating a method for fabricating a 3D integrated circuit (IC) device package, according to an aspect of the present disclosure.

FIG. 10 is a process flow diagram illustrating a method for fabricating a 3D IC device package, according to an aspect of the present disclosure. A method 1000 begins in block 1002, in which a power delivery network is formed on a temporary carrier wafer concurrent with forming of a material separation layer within a semiconductor substrate. As shown in FIGS. 9A-9G, the semiconductor substrate 402, including the material separation layer 922 and the active layer 420, is formed concurrently with the backside power delivery network 450.

At block 1004, an exposed surface of the backside power delivery network is bonded to an active layer of the semiconductor substrate. For example, as shown in FIG. 9H, a layer transfer process is performed to bond the active layer 420 of the semiconductor substrate 402 to the bonding material 410 of the backside power delivery network 450. In this example, the backside process is completed prior to performing a smart-cut process, as shown in FIG. 9I.

At block 1006, the semiconductor substrate is separated at the material separation layer to expose a surface of the active layer. For example, as shown in FIG. 9I, at step 950, a smart-cut process cuts the semiconductor substrate 402 at the material separation layer 922 to expose a front side surface of the active layer 420. At block 1008, a first die is formed from the active layer having a first surface opposite the active layer. For example, as shown in FIG. 9K, at step 970, a front side process is performed on the active layer 420 to form the logic die 430. In this example, the logic die 430 is formed by fabricating the active devices 422 from the active layer 420. These active devices 422 may be transistors or other like devices to implement the logic die 430. Once the active devices 422 are formed, the BEOL metallization structure 432 is formed to couple the active devices 422 to contact pads 438 to complete the logic die 430.

At block 1010, a second die is bonded to the first surface of the first die. For example, as shown in FIG. 9L, at step 980, a front side surface 474 of a memory die 470 is bonded to the front side surface 434 of the logic die 430. For example, the memory die 470 may include a wafer 480, having active devices 482 formed on the wafer 480. In this example, the active devices 482 are coupled to a BEOL metallization structure 472 and contact pads 478 at the front side surface 474 distal from a backside surface 476 of the memory die 470. In addition, the contact pads 478 of the memory die 470 are coupled to contact pads 438 of the logic die 430.

The method 1000 may further include removing the carrier wafer to expose an oxide material layer of the power delivery network, opposite a bonding material layer of the power delivery network. In addition, the method 1000 may also include forming contact pads within the oxide material layer and coupled to the power delivery network. The method 1000 may further include forming package bumps coupled to the contact pads within the oxide material layer of the power delivery network. For example, as shown in FIG. 9M, at step 990, the carrier wafer 532 is de-bonded from a surface of the oxide material 412. In this configuration, the memory die 470 is integrated on the front side surface 434 of the logic die 430 to form the 3D IC device 800. As further illustrated in FIG. 9N, package balls 490 are formed on pads 492 within the oxide material 412 for coupling to the backside power delivery network 450.

According to a further aspect of the present disclosure, a 3D IC device package includes face-to-face dies having a backside power delivery network. In one configuration, the 3D IC device package includes means for storing data. In one configuration, the data storing means may be the memory die 470, as shown in FIGS. 8 and 9L-9N. In another aspect, the aforementioned means may be any structure or any material configured to perform the functions recited by the aforementioned means.

Figure 11:
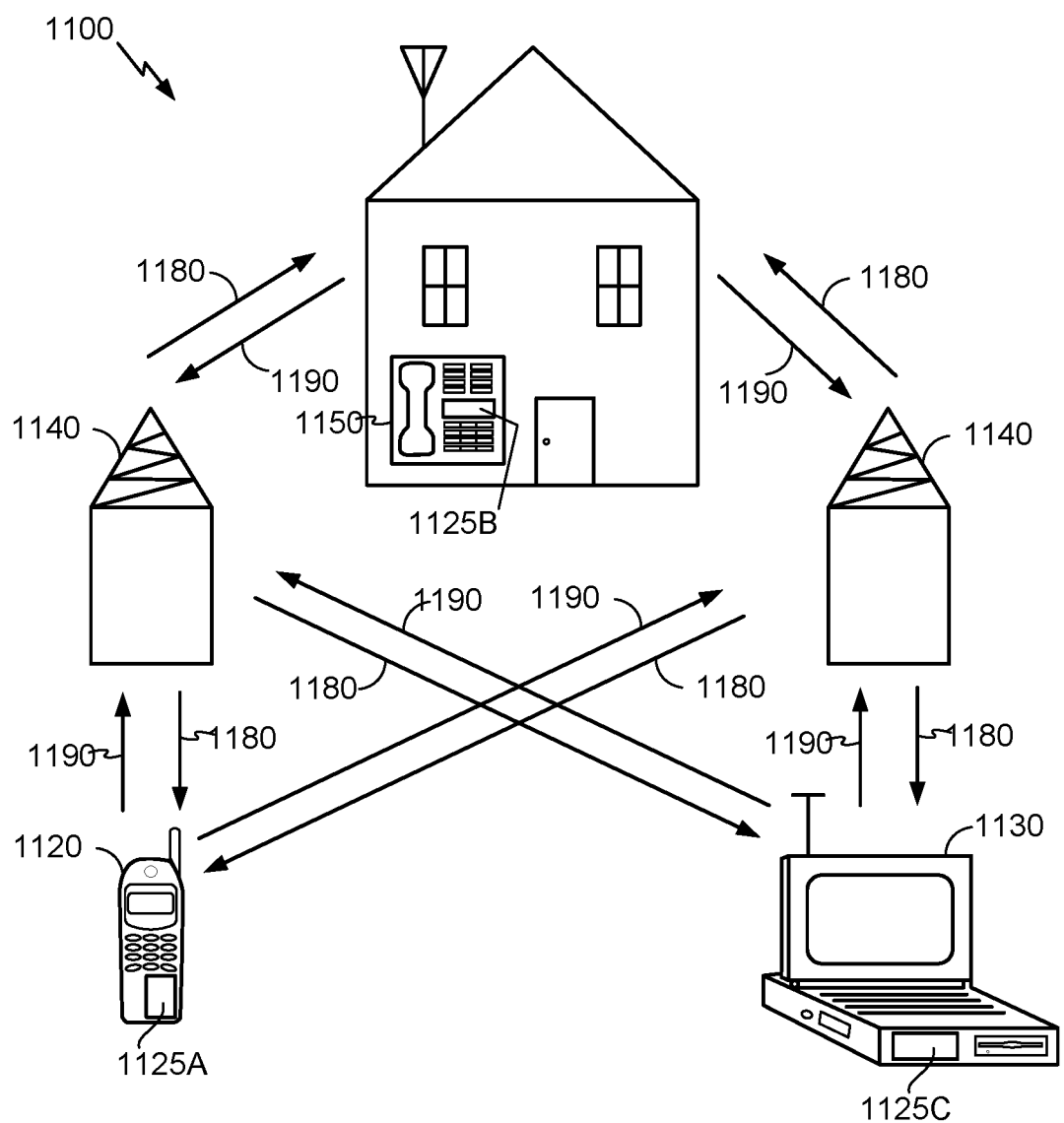
FIG. 11 is a block diagram showing an exemplary wireless communications system in which a configuration of the present disclosure may be advantageously employed.

FIG. 11 is a block diagram showing an exemplary wireless communications system 1100 in which an aspect of the present disclosure may be advantageously employed. For purposes of illustration, FIG. 11 shows three remote units 1120, 1130, and 1150, and two base stations 1140. It will be recognized that wireless communications systems may have many more remote units and base stations. Remote units 1120, 1130, and 1150 include IC devices 1125A, 1125B, and 1125C that include the disclosed 3D IC device integrated with a backside power delivery network. It will be recognized that other devices may also include the disclosed 3D IC device integrated with a backside power delivery network, such as the base stations, switching devices, and network equipment. FIG. 11 shows forward link signals 1180 from the base stations 1140 to the remote units 1120, 1130, and 1150, and reverse link signals 1190 from the remote units 1120, 1130, and 1150 to the base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 11 illustrates remote units according to the aspects of the present disclosure, the disclosure is not limited to these exemplary illustrated units. Aspects of the present disclosure may be suitably employed in many devices, which include the disclosed 3D IC device integrated with a backside power delivery network.

Figure 12:
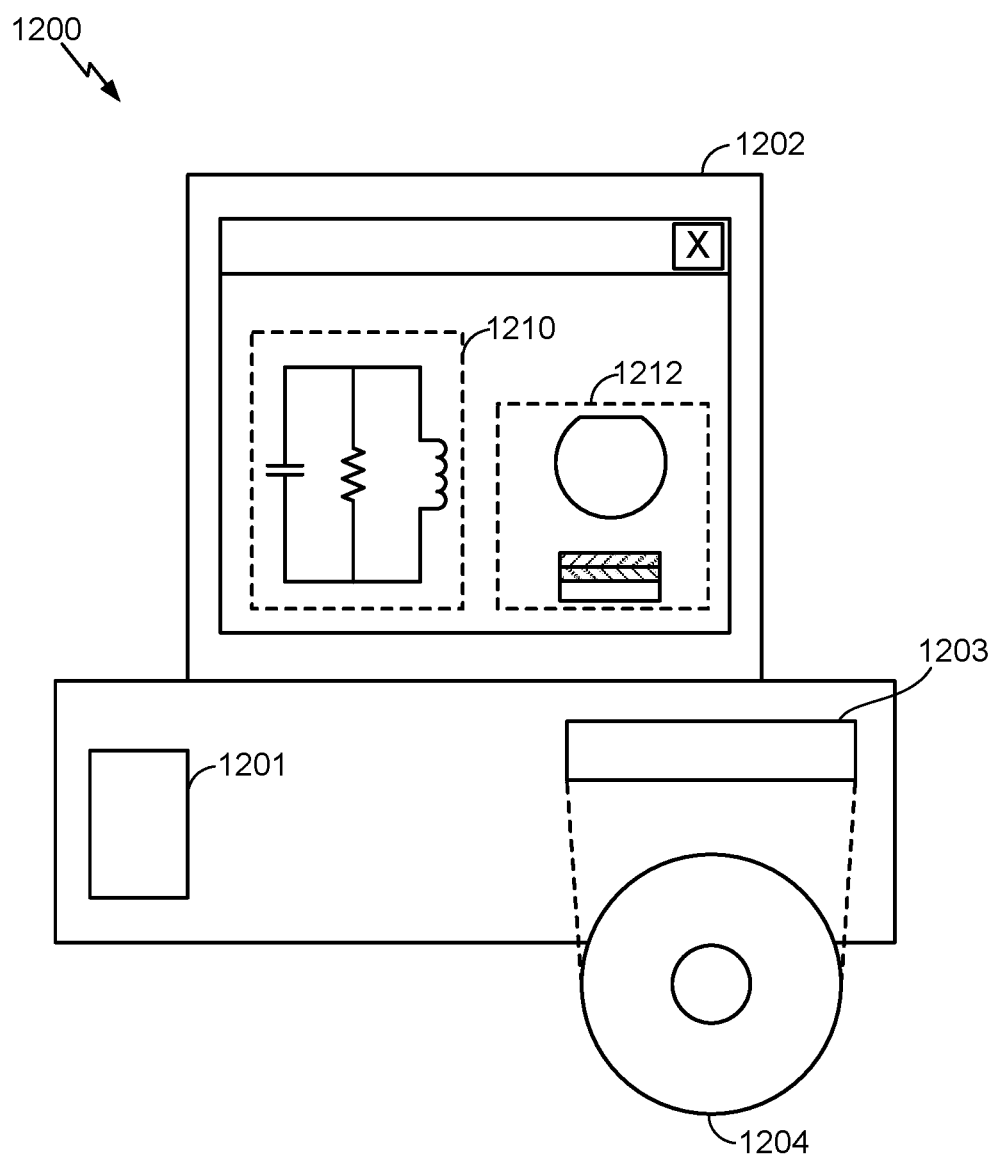
FIG. 12 is a block diagram illustrating a design workstation used for circuit, layout, and logic design of a semiconductor component according to one configuration.

FIG. 12 is a block diagram illustrating a design workstation 1200 used for circuit, layout, and logic design of a semiconductor component, such as the capacitors disclosed above. The design workstation 1200 includes a hard disk 1201 containing operating system software, support files, and design software such as Cadence or OrCAD. The design workstation 1200 also includes a display 1202 to facilitate design of a circuit 1210 or a semiconductor component 1212, such as a 3D IC device integrated with a backside power delivery network. A storage medium 1204 is provided for tangibly storing the design of the circuit 1210 or the semiconductor component 1212 (e.g., the 3D IC device integrated with a backside power delivery network). The design of the circuit 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the semiconductor component 1212 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present disclosure is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   a power delivery network comprising a bonding material layer as a first outer surface layer of the power delivery network, the power delivery network further comprising a second outer surface layer that is opposite the bonding material layer, the bonding material layer partially surrounding interconnects that are exposed to an active layer of a first die;
   the first die having a first outer surface layer and the active layer as a second outer surface layer, opposite the first outer surface layer, the active layer directly on the bonding material layer and the interconnects of the power delivery network;
   a second die having a first outer surface layer directly on the first outer surface layer of the first die; and
   package bumps on the second outer surface layer of the power delivery network and coupled to contact pads of the power delivery network.

2. The IC package of claim 1,
   in which the first die comprises:
      first active devices;
      a first back-end-of-line (BEOL) metallization structure coupled to the first active devices; and
      first contact pads in the first outer surface layer of the first die and coupled to the first BEOL metallization structure; and
   in which the second die comprises:
      second active devices;
      a second BEOL metallization structure coupled to the second active devices; and
      second contact pads in the first outer surface layer of the second die and coupled to the second BEOL metallization structure, in which the second contact pads of the second die are directly on the first contact pads of the first die.

3. The IC package of claim 1, in which the power delivery network comprises:
   an oxide layer as the second outer surface layer of the power delivery network, wherein the contact pads of the power delivery network are placed within the oxide layer.

4. The IC package of claim 1, in which the first outer surface layer of the first die is directly bonded to the first outer surface layer of the second die.

5. The IC package of claim 1, in which the first die comprises a logic die and the second die comprises a memory die.

6. The IC package of claim 1, in which a first layer of the power delivery network comprises an oxide material.

7. The IC package of claim 1, in which the package bumps comprise package solder balls coupled to the contact pads of the power delivery network.

8. An integrated circuit (IC) package, comprising:
   a power delivery network; comprising a bonding material layer as a first outer surface layer of the power delivery network, the power delivery network further comprising a second outer surface layer that is opposite the bonding material layer, the bonding material layer partially surrounding interconnects that are exposed to an active layer of a first die;
   the first die having a first outer surface layer and the active layer as a second outer surface layer, opposite the first outer surface layer, the active layer directly on the bonding material layer and the interconnects of the power delivery network;
   means for storing data having a first outer surface layer directly on the first outer surface layer of the first die; and
   package bumps on the second outer surface layer of the power delivery network and coupled to contact pads of the power delivery network.

9. The IC package of claim 8, in which a first layer of the power delivery network comprises an oxide material.

10. The IC package of claim 8, in which the package bumps comprise package solder balls coupled to the contact pads of the power delivery network.

* * * * *